United States Patent
Toyoguchi et al.

(10) Patent No.: US 9,224,767 B2
(45) Date of Patent: Dec. 29, 2015

(54) METHOD FOR DRIVING PHOTOELECTRIC CONVERSION APPARATUS

(71) Applicant: CANON KABUSHIKI KAISHA, Tokyo (JP)

(72) Inventors: Ginjiro Toyoguchi, Tokyo (JP); Yuichiro Yamashita, Hsinchu (TW); Takeshi Kojima, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/621,236

(22) Filed: Feb. 12, 2015

(65) Prior Publication Data

US 2015/0155315 A1 Jun. 4, 2015

Related U.S. Application Data

(63) Continuation of application No. 13/765,001, filed on Feb. 12, 2013, now Pat. No. 8,988,573.

(30) Foreign Application Priority Data

Feb. 17, 2012 (JP) ................................. 2012-033360

(51) Int. Cl.

| H01L 27/146 | (2006.01) |
|---|---|
| H01L 27/148 | (2006.01) |
| H04N 5/353 | (2011.01) |
| H04N 5/374 | (2011.01) |
| H04N 5/359 | (2011.01) |
| H04N 5/357 | (2011.01) |

(52) U.S. Cl.
CPC .... *H01L 27/14601* (2013.01); *H01L 27/14806* (2013.01); *H04N 5/353* (2013.01); *H04N 5/374* (2013.01); *H01L 27/14609* (2013.01); *H01L 27/14623* (2013.01); *H04N 5/3575* (2013.01); *H04N 5/3592* (2013.01)

(58) Field of Classification Search
CPC ................... H01L 27/14601; H01L 27/14806; H04N 3/155; H04N 5/335; H04N 5/353; H04N 5/374; H04N 5/3592
USPC .......... 348/294, 308, 314; 257/291; 250/208.1
See application file for complete search history.

(56) References Cited

U.S. PATENT DOCUMENTS

| 2010/0091158 A1* | 4/2010 | Yamashita ..................... 348/300 |
| 2011/0025896 A1* | 2/2011 | Yamashita et al. ............. 348/294 |

FOREIGN PATENT DOCUMENTS

JP  2006-246450 A  9/2006

* cited by examiner

*Primary Examiner* — Nhan T Tran
(74) *Attorney, Agent, or Firm* — Canon USA, Inc. IP Division

(57) ABSTRACT

In a photoelectric conversion apparatus including a plurality of pixels arranged in a matrix, each pixel including a photoelectric conversion unit, first and second holding units that hold electric charge, a first transfer unit that connects the photoelectric conversion unit and the first holding unit, a second transfer unit that connects the first and second holding units, and a third transfer unit that connects the photoelectric conversion unit and a power supply, each pixel is controlled so that the potential of the third transfer unit for electric charge held in the photoelectric conversion unit is higher than that of the first transfer unit at least during a charge accumulation period of the pixel, and thereafter, the potential of the third transfer unit is higher than that of the photoelectric conversion unit while the potentials of the first and second transfer units are lower than that of the photoelectric conversion unit.

7 Claims, 16 Drawing Sheets

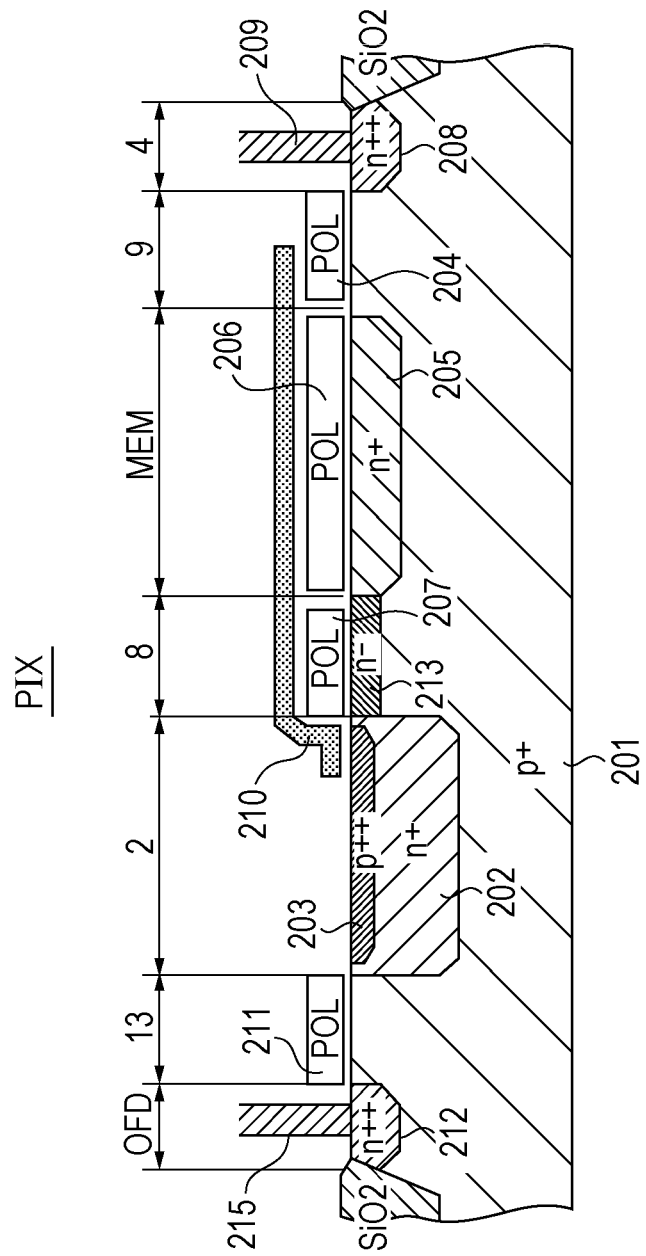

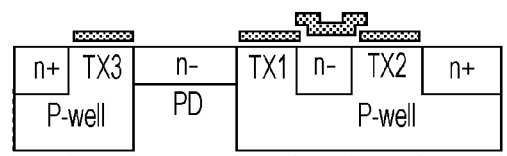
FIG. 4A
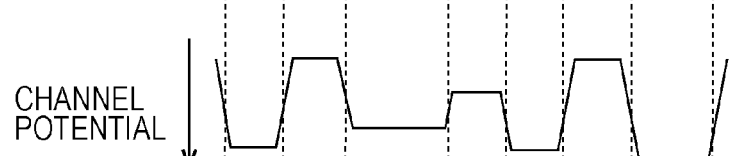
FIG. 4B CHANNEL POTENTIAL ↓
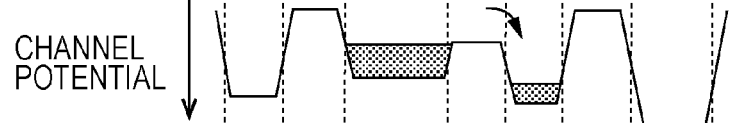
FIG. 4C CHANNEL POTENTIAL ↓
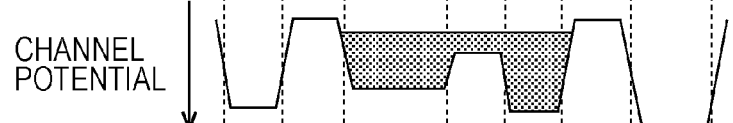
FIG. 4D CHANNEL POTENTIAL ↓
FIG. 4E CHANNEL POTENTIAL ↓
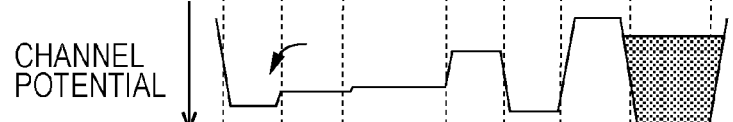
FIG. 4F CHANNEL POTENTIAL ↓
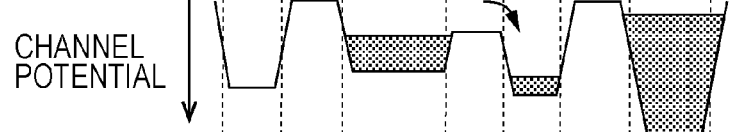
FIG. 4G CHANNEL POTENTIAL ↓
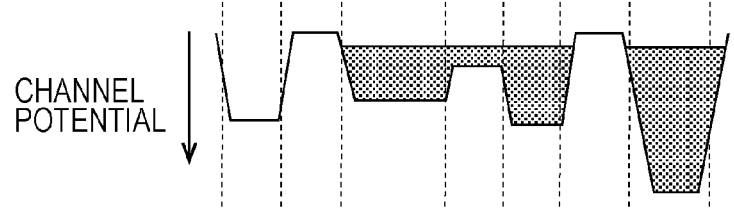
FIG. 4H CHANNEL POTENTIAL ↓

FIG. 6B CHANNEL POTENTIAL 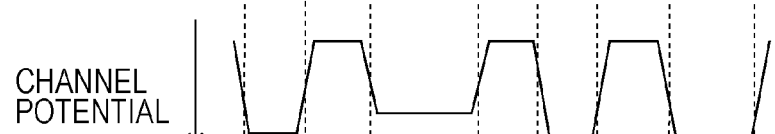
FIG. 6C CHANNEL POTENTIAL 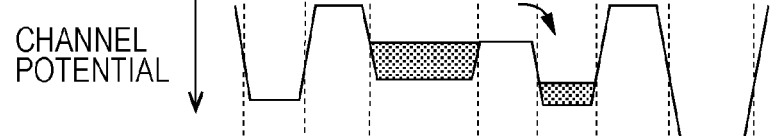
FIG. 6D CHANNEL POTENTIAL 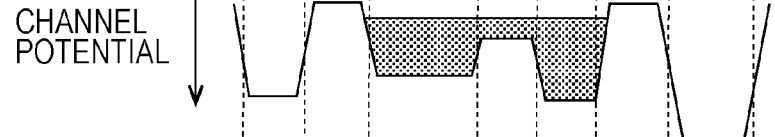
FIG. 6E CHANNEL POTENTIAL 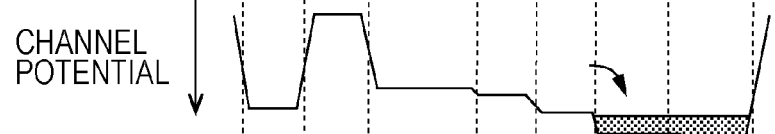
FIG. 6F CHANNEL POTENTIAL 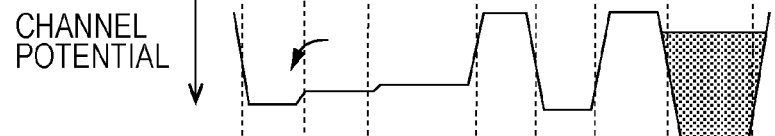
FIG. 6G CHANNEL POTENTIAL 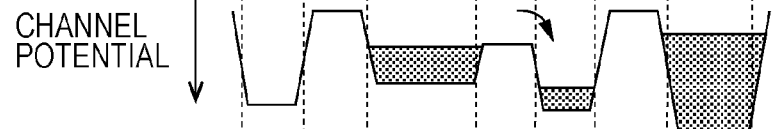
FIG. 6H CHANNEL POTENTIAL 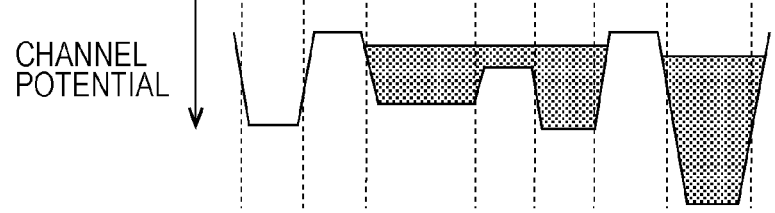

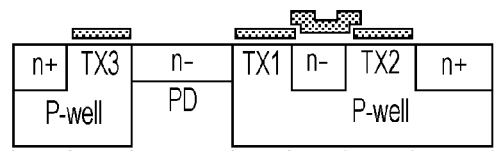
FIG. 8A
FIG. 8B  CHANNEL POTENTIAL
FIG. 8C  CHANNEL POTENTIAL
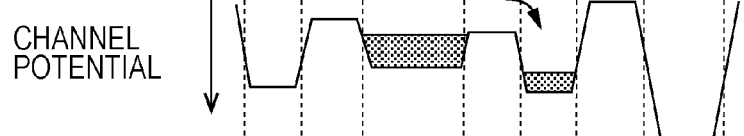
FIG. 8D  CHANNEL POTENTIAL
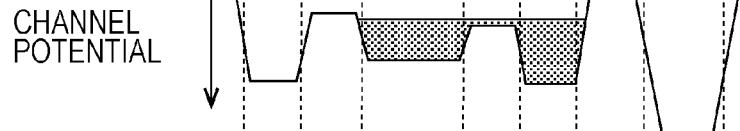
FIG. 8E  CHANNEL POTENTIAL
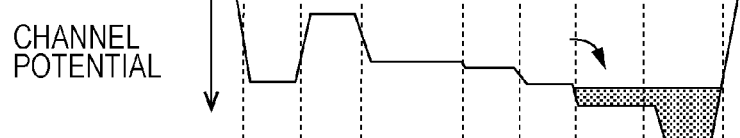
FIG. 8F  CHANNEL POTENTIAL
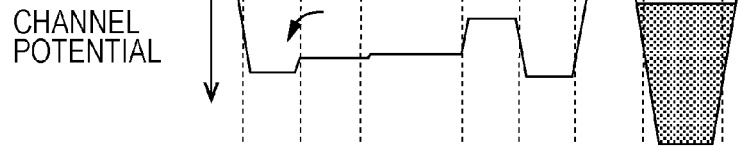
FIG. 8G  CHANNEL POTENTIAL
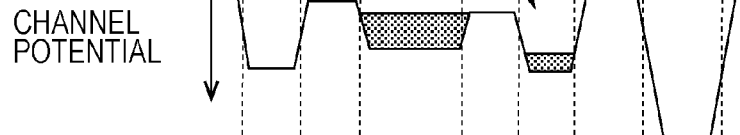
FIG. 8H  CHANNEL POTENTIAL
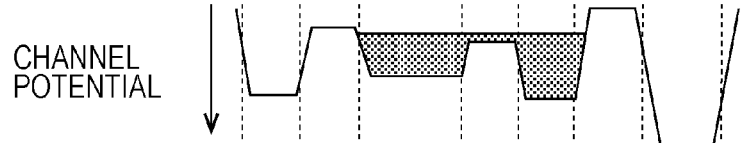

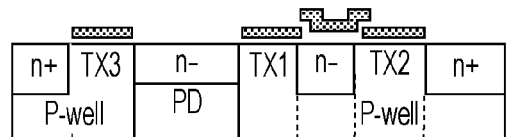
FIG. 12A
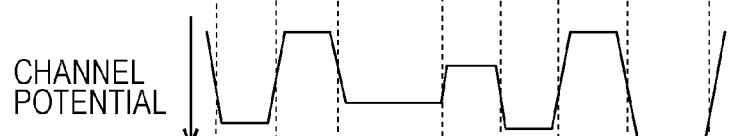
FIG. 12B  CHANNEL POTENTIAL
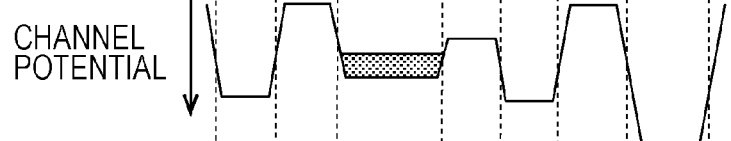
FIG. 12C  CHANNEL POTENTIAL
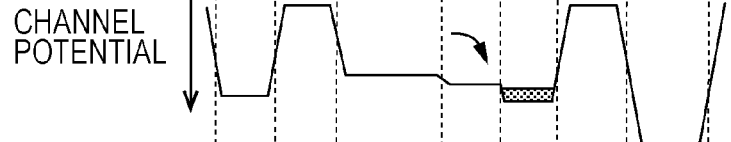
FIG. 12D  CHANNEL POTENTIAL
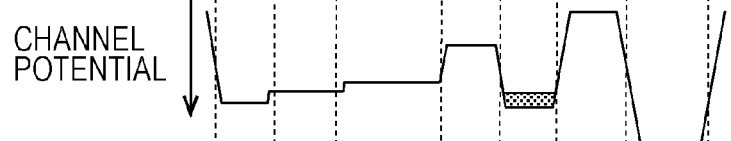
FIG. 12E  CHANNEL POTENTIAL
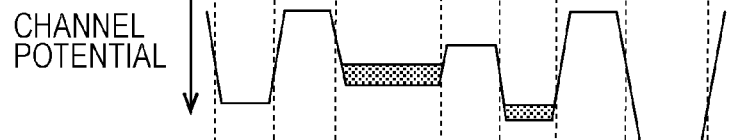
FIG. 12F  CHANNEL POTENTIAL
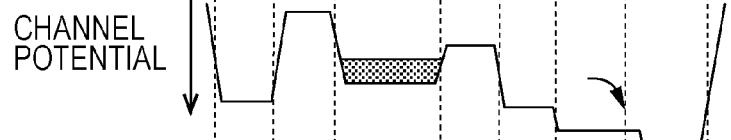
FIG. 12G  CHANNEL POTENTIAL
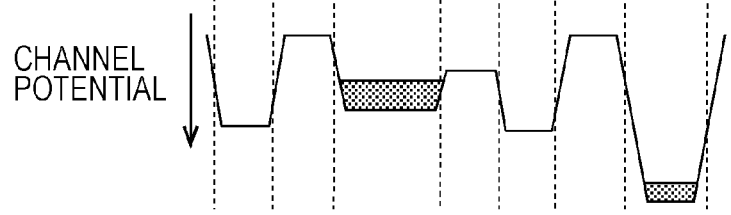
FIG. 12H  CHANNEL POTENTIAL

METHOD FOR DRIVING PHOTOELECTRIC CONVERSION APPARATUS

CROSS-REFERENCE TO RELATED APPLICATION

This application is a Continuation of U.S. application Ser. No. 13/765001, filed Feb. 12, 2013, which claims priority from Japanese Patent Application No. 2012-033360 filed Feb. 17, 2012, which are hereby incorporated by reference herein in their entireties.

BACKGROUND OF THE INVENTION

1. Field of the Invention

One disclosed aspect of the embodiments relates to a photoelectric conversion apparatus, an imaging system, and a method for driving a photoelectric conversion apparatus.

2. Description of the Related Art

For a photoelectric conversion apparatus having an imaging plane formed by a plurality of pixels, a technology called an in-plane synchronized electronic shutter technology in which charge accumulation start times and end times are matched across all the pixels in the imaging plane is known.

Japanese Patent Laid-Open No. 2006-246450 discloses a configuration in which an electric charge accumulation unit is provided separately from a photoelectric conversion unit and most of the electric charge generated in the photoelectric conversion unit is not accumulated in the photoelectric conversion unit but is transferred to the electric charge accumulation unit. After the end of the accumulation period, the electric charge accumulated in the photoelectric conversion unit is transferred to the electric charge accumulation unit and is then further transferred to a floating diffusion unit from the electric charge accumulation unit. A voltage signal corresponding to the amount of electric charge accumulated in the floating diffusion unit is output from the associated pixel.

In the operation disclosed in Japanese Patent Laid-Open No. 2006-246450, the electric charge generated in the photoelectric conversion unit is discharged to a power supply during a period from when electric charge is transferred to the floating diffusion unit to when a voltage signal is output from the associated pixel. Thus, the signal charge generated during the period is lost, and therefore there is a concern that an image with low temporal resolution may be obtained.

The embodiments have been made in light of the foregoing issue.

SUMMARY OF THE INVENTION

An aspect of the embodiments provides a method for driving a photoelectric conversion apparatus. The photoelectric conversion apparatus includes a plurality of pixels arranged in a matrix. Each of the plurality of pixels includes a photoelectric conversion unit, a first holding unit configured to hold electric charge, a second holding unit configured to hold electric charge, a first transfer unit configured to connect the photoelectric conversion unit and the first holding unit, a second transfer unit configured to connect the first holding unit and the second holding unit, and a third transfer unit configured to connect the photoelectric conversion unit and a power supply. The method includes controlling each of the plurality of pixels so that a potential of the third transfer unit with respect to electric charge held in the photoelectric conversion unit is higher than a potential of the first transfer unit with respect to the electric charge held in the photoelectric conversion unit at least in a period during which the pixel accumulates electric charge, and thereafter, the potential of the third transfer unit is higher than a potential of the photoelectric conversion unit with respect to the electric charge held in the photoelectric conversion unit and the potentials of the first transfer unit and the second transfer unit are lower than the potential of the photoelectric conversion unit.

Further features of the disclosure will become apparent from the following description of exemplary embodiments with reference to the attached drawings.

BRIEF DESCRIPTION OF THE DRAWINGS

FIG. 3 is a cross-sectional view illustrating the configuration of a pixel according to the first exemplary embodiment.

FIGS. 4A to 4H are diagrams illustrating the cross section of a pixel according to the first exemplary embodiment and the potential across the pixel.

FIGS. 6A to 6H are diagrams illustrating the cross section of a pixel according to a second exemplary embodiment and the potential across the pixel.

FIGS. 8A to 8H are diagrams illustrating the cross section of a pixel according to a third exemplary embodiment and the potential across the pixel.

FIGS. 12A to 12H are diagrams illustrating the cross section of a pixel according to a fifth exemplary embodiment and the potential across the pixel.

DESCRIPTION OF THE EMBODIMENTS

First Exemplary Embodiment

Figure 1:
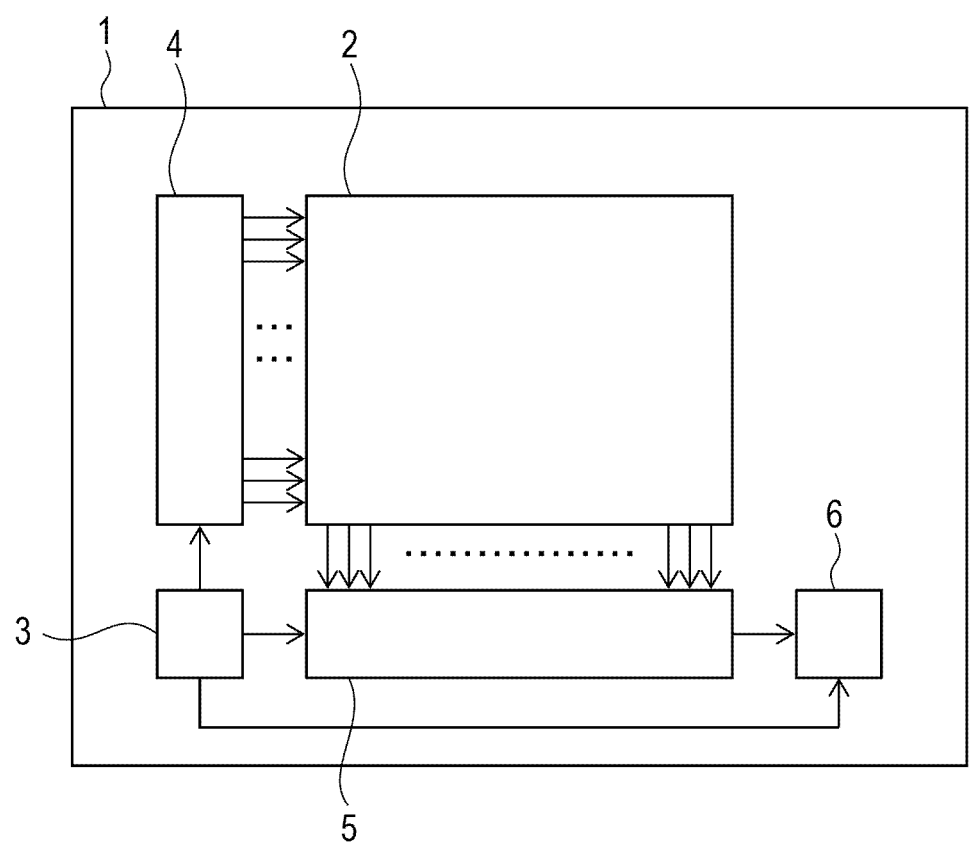
FIG. 1 is a block diagram illustrating the configuration of a photoelectric conversion apparatus according to a first exemplary embodiment.

FIG. 1 illustrates an example of an overall block diagram of a photoelectric conversion apparatus 1. The photoelectric conversion apparatus 1 may be formed on a single chip using a semiconductor substrate. The photoelectric conversion apparatus 1 includes an imaging region 2 in which a plurality of pixels are arranged. The photoelectric conversion apparatus 1 further includes a control unit 3. The control unit 3 supplies a control signal, a power supply voltage, and the like to a vertical scanning unit 4, a signal processing unit 5, and an output unit 6.

The vertical scanning unit 4 supplies drive pulses to the plurality of pixels arranged in the imaging region 2. The drive pulses are generally supplied pixel row by pixel row or in units of blocks each including a plurality of pixel rows. The vertical scanning unit 4 may be implemented using a shift register or an address decoder.

The signal processing unit 5 includes a column circuit, a horizontal scanning circuit, and a horizontal output line. The column circuit includes a plurality of circuit blocks configured to respectively receive signals of a plurality of pixels included in a pixel row selected by the vertical scanning unit 4. Each of the circuit blocks may include any of a signal holding unit, an amplifier circuit, a noise reduction circuit, and an analog-to-digital conversion circuit, or a combination thereof. The horizontal scanning circuit may be implemented using a shift register or an address decoder.

The output unit 6 outputs a signal transmitted via the horizontal output line to the outside of the photoelectric conversion apparatus 1. The output unit 6 includes a buffer or an amplifier circuit.

Figure 2:
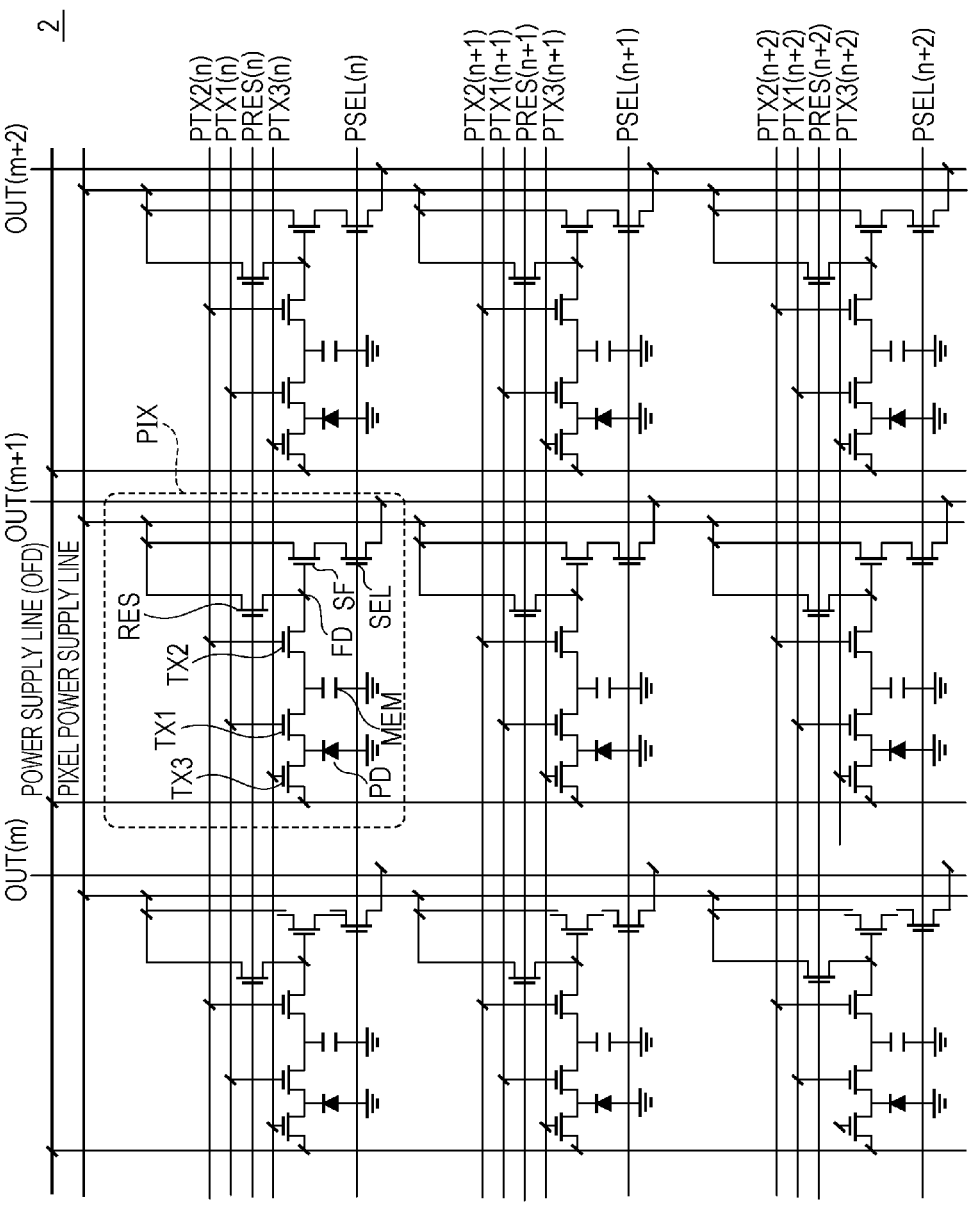
FIG. 2 is an equivalent circuit diagram illustrating the configuration of an imaging region according to the first exemplary embodiment.

Next, the configuration of the imaging region 2 will be described with reference to FIG. 2. FIG. 2 is an equivalent circuit diagram of pixels included in the imaging region 2. The imaging region 2 has pixels arranged thereon in a matrix. For ease of description, the pixels in the n-th to (n+2)-th rows and the m-th to (m+2)-th columns, i.e., three rows and three columns of pixels, are illustrated as an example. In the illustration, one of the pixels is surrounded by a dotted line and is represented by PIX.

A photodiode PD that is a photoelectric conversion unit PD has an anode coupled to a fixed ground potential, and a cathode connected to one terminal of a first holding unit MEM via a first transfer switch TX1 that is a first transfer unit. The cathode is further connected to a power supply line that is a second power supply serving as an overflow drain (OFD) via a third transfer switch TX3 that is a third transfer unit. The other terminal of the first holding unit MEM is coupled to a fixed ground potential. The one terminal of the first holding unit MEM is further connected to a gate terminal of an amplification transistor SF via a second transfer switch TX2 that is a second transfer unit. The gate terminal of the amplification transistor SF is connected to a pixel power supply line via a reset transistor RES that is a reset unit. In the illustrated example, each of the first to third transfer units is formed of a transistor. In FIG. 2, some of the signals to be supplied to the control electrodes of the individual transistors are carried on the power supply line serving as an OFD, and others are carried on the pixel power supply line. The power supply line and the pixel power supply line may be connected to a common power supply.

A selection transistor SEL has two main electrodes, one of which is connected to a vertical signal line OUT and the other of which is connected to one main electrode of the amplification transistor SF. When an active signal PSEL is input to the control electrode of the selection transistor SEL, the two main electrodes of the selection transistor SEL are brought into a conductive state. Accordingly, the amplification transistor SF and a constant current source (not illustrated) provided on the vertical signal line OUT form a source follower circuit, and a signal corresponding to the potential at the control electrode, or the gate terminal, of the amplification transistor SF appears on the vertical signal line OUT. A signal is output from the photoelectric conversion apparatus 1 in accordance with the signal appearing on the vertical signal line OUT, and is displayed as an image through the signal processing unit 5 described above and the like. Further, a node FD that is a floating diffusion (FD) unit to which the gate terminal of the amplification transistor SF and the main electrodes of the reset transistor RES and the second transfer switch TX2 are commonly connected has a capacitance value, and is configured to hold electric charge. In the following description, the FD unit is referred to as a second holding unit.

FIG. 3 illustrates an example of a cross-sectional view of the pixel PIX illustrated in FIG. 2, which is formed on a semiconductor substrate. The elements corresponding to those illustrated in FIG. 2 are given the same numerals or symbols. The conductivity types of semiconductor regions will be described here in the context in which electrons are used as signal charge carriers. If holes are used as signal charge carriers, the conductivity types of the semiconductor regions may be reversed.

A P-type semiconductor region 201 may be formed by injecting P-type impurity ions into an N-type semiconductor substrate or may be implemented using a P-type semiconductor substrate.

An N-type semiconductor region (first-conductivity-type first semiconductor region) 202 is included in the photoelectric conversion unit PD. The N-type semiconductor region 202 has the same polarity as the signal charge carriers, or electrons. The N-type semiconductor region 202 forms a PN junction with part of the P-type semiconductor region 201 (second-conductivity-type second semiconductor region).

A P-type semiconductor region 203 is provided on a surface of the N-type semiconductor region 202. The P-type semiconductor region 203 is provided to make the photoelectric conversion unit PD serve as a buried photodiode, and the influence of interface states is reduced to prevent the occurrence of dark current on the surface of the photoelectric conversion unit PD. The photoelectric conversion unit PD at least includes the first semiconductor region and the second semiconductor region that forms a PN junction with the first semiconductor region.

A second transfer electrode 204 forms a second transfer switch 9. The potential state between an electric charge holding unit and an electric charge/voltage conversion unit (or a fourth semiconductor region described below) is controllable in accordance with the voltage supplied to the second transfer electrode 204. The second transfer electrode 204 is disposed above a second path, which is located between a third semiconductor region described below and the fourth semiconductor region, with an insulating film interposed between the second transfer electrode 204 and the second path.

An N-type semiconductor region (first-conductivity-type third semiconductor region) 205 is included in the first holding unit MEM. The N-type semiconductor region 205 is configured to be capable of accumulating the electric charge transferred from the photoelectric conversion unit PD for a certain time period. A control electrode 206 is disposed above the third semiconductor region 205 with an insulating film interposed therebetween, and is configured to be capable of controlling the potential state of a region in the third semiconductor region 205 that is near the interface of the insulating film. A voltage is supplied to the control electrode 206 in a period during which electric charge is held in the first holding unit MEM, thus allowing a reduction in the influence of dark current occurring near the interface of the N-type semiconductor region 205 with a surface oxide film. As described below, the voltage to be supplied at this time may be a negative voltage because holes need to be collected at the interface between the third semiconductor region 205 and the insulating film, and a voltage of, for example, approximately −3 V is supplied. This voltage may be changed as desired in accordance with the impurity concentration of the third semiconductor region 205.

The first holding unit MEM includes the N-type semiconductor region 205 and the control electrode 206.

A first transfer electrode 207 forms a first transfer switch 8. The first transfer electrode 207 is configured to be capable of controlling the potential state of a first path located between the photoelectric conversion unit PD and the first holding unit MEM. The first transfer switch 8 has a semiconductor region 213 disposed below the first transfer electrode 207 between the N-type semiconductor region 202 and the N-type semiconductor region 205. The semiconductor region 213 has a concentration lower than the N-type semiconductor region 202. Such a buried channel structure may provide a potential relationship described below with reference to FIGS. 4A to 4H.

A floating diffusion (FD) region 208 corresponds to the FD unit. The FD region 208 serves as an electric charge/voltage conversion unit. The FD region 208 is electrically connected to a gate of an amplification metal oxide semiconductor (MOS) transistor via a plug 209 and the like.

A light shielding film 210 is disposed to prevent incident light from entering the first holding unit MEM. It is desirable that the light shielding film 210 cover at least the first holding unit MEM. In terms of further improved light shielding performance, as illustrated in FIG. 3, the light shielding film 210 may extend over the entirety of the first transfer electrode 207 and up to the top of part of the second transfer electrode 204.

A control electrode 211 for discharging electric charge forms a third transfer switch 13. The control electrode 211 is configured to be capable of controlling the potential state of a third path located between the photoelectric conversion unit PD and the OFD. The control electrode 211 is disposed above the third path with an insulating film interposed therebetween. The control electrode 211 controls the potential state so that the electric charge generated in the photoelectric conversion unit PD by incident light may be discharged to the OFD. The length of the accumulation period (or exposure period) of the photoelectric conversion unit PD is controllable in accordance with the voltage supplied to the control electrode 211.

A portion (fifth semiconductor region) 212 is included in the OFD, and a plug 215 for supplying a power supply voltage to the portion 212 is connected to the power supply (not illustrated). That is, a second power supply is configured to include the portion 212 and the plug 215.

The first transfer switch 8, the photoelectric conversion unit PD, and the first holding unit MEM form a first transfer transistor. The second transfer switch 9, the first holding unit MEM, and the FD unit form a second transfer transistor. The third transfer switch 13, the photoelectric conversion unit PD, and the second power supply form a third transfer transistor.

A plurality of unit pixels, one of which has been described with reference to FIGS. 2 and 3, may be arranged in a two-dimensional array to form an imaging region of a photoelectric conversion apparatus. The pixels may be configured such that a reset unit, an amplification unit, a selection unit, and the like are shared by a plurality of photoelectric conversion units PD.

Next, an operation according to this exemplary embodiment will be described with reference to the drawings.

FIG. 4A illustrates a portion of the pixel PIX illustrated in FIG. 3, where the illustration of the light shielding film 210, the plugs 209 and 215, and so forth is omitted. As illustrated in FIG. 4A, a portion of the electrode 206 that controls the potential of the first holding unit may overlap the electrodes 207 and 204 that control the potentials of the first and second transfer units, respectively.

In this exemplary embodiment, when the signals PTX1 to PTX3 for controlling the potentials of the first to third transfer units are in the low level, the potential of the first transfer unit is higher than the potentials of the second and third transfer units. This relationship may be obtained by, for example, configuring the first transfer unit to have a buried channel structure.

FIGS. 4B to 4H are diagrams illustrating the potentials of the respective regions of the pixel PIX illustrated in FIG. 4A, which are obtained at individual time points. In FIGS. 4B to 4H, the horizontal axis represents the positions of the elements corresponding to those illustrated in FIG. 4A, and the vertical axis represents potential, where the potential with respect to positive electric charge is shown increasing in the downward direction. In this exemplary embodiment, since the electric charge carriers to be accumulated in the photoelectric conversion unit PD are electrons, the potential with respect to electrons is shown increasing in the upward direction in the drawings.

FIG. 4B illustrates a state where no electric charge is accumulated in the photoelectric conversion unit PD or in the first or second holding unit. In this state, when the photoelectric conversion unit PD is irradiated with light, the generated electrons are accumulated in the n-region. In this state, the potentials of the first and third transfer units with respect to the electrons are higher than the potential of the photoelectric conversion unit PD, and electric charge may be accumulated in the photoelectric conversion unit PD. In other words, potential barriers with respect to the electrons are formed in the first and third transfer units. Since the potential of the third transfer unit with respect to the electrons is higher than the potential of the first transfer unit with respect to the electrons, the electric charge saturation level of the photoelectric conversion unit PD is determined in accordance with the potential of the first transfer unit. In other words, the potential barrier formed in the first transfer unit with respect to the electrons is lower than the potential barrier formed in the third transfer unit.

As the exposure of the photoelectric conversion unit PD progresses, the amount of electric charge generated in the photoelectric conversion unit PD exceeds the electric charge saturation level of the photoelectric conversion unit PD. As described earlier, since the potential of the third transfer unit with respect to the electrons is higher than the potential of the first transfer unit, electrons generated in excess of the electric charge saturation level of the photoelectric conversion unit PD flows into the first holding unit via the first transfer unit. This state is illustrated in FIG. 4C. In FIG. 4C, black shaded portions represent electrons. The state illustrated in FIG. 4C is a state where the photoelectric conversion unit PD is saturated and electrons are also held in the first holding unit via the first transfer unit.

As the exposure of the photoelectric conversion unit PD further progresses from the state illustrated in FIG. 4C, the electrons generated in the photoelectric conversion unit PD may also exceed the electric charge saturation level of the first holding unit which is determined in accordance with the potential of the first transfer unit. That is, electric charge is accumulated in the photoelectric conversion unit PD, the first transfer unit, and the first holding unit. This state is illustrated in FIG. 4D. In other words, the photoelectric conversion unit PD, the first transfer unit, and the first holding unit serve as a holding unit that holds electric charge.

Then, the electric charge held in the photoelectric conversion unit PD, the first transfer unit, and the first holding unit is transferred to the second holding unit. At this time, the potential with respect to the electrons has a slope from the photoelectric conversion unit PD to the second holding unit so that the electric charge held in the photoelectric conversion unit PD may also be sufficiently transferred. This state is illustrated in FIG. 4E.

Then, the potential of the second transfer unit with respect to the electrons is sufficiently increased to prevent electric charge from entering the second holding unit from the first holding unit. Since the potential of the first transfer unit with respect to the electrons is made higher than that of the photoelectric conversion unit PD and the potential of the third transfer unit with respect to the electrons is made lower than that of the photoelectric conversion unit PD, the electrons generated in the photoelectric conversion unit PD are discharged to the power supply via the third transfer unit. Therefore, the photoelectric conversion unit PD may be reset. This state is illustrated in FIG. 4F.

The operation illustrated in FIGS. 4B to 4F is performed simultaneously on all the pixels to implement an in-plane synchronized shutter. The pixels are sequentially selected in the state illustrated in FIG. 4F, thus allowing a signal corresponding to the amount of electric charge held in the second holding unit to be read from each of the pixels. The second holding unit is reset after a signal has been read.

After the photoelectric conversion unit PD is reset in the state illustrated in FIG. 4F, increasing the potential of the third transfer unit with respect to the electrons so as to be higher than that of the photoelectric conversion unit PD allows the photoelectric conversion unit PD to accumulate electric charge again. This state is illustrated in FIG. 4G. In the state illustrated in FIG. 4G, similarly to the state illustrated in FIG. 4C, electric charge is generated in excess of the electric charge saturation level of the photoelectric conversion unit PD.

As the exposure of the photoelectric conversion unit PD further progresses from the state illustrated in FIG. 4G, as in the state illustrated in FIG. 4D, the photoelectric conversion unit PD, the first transfer unit, and the first holding unit hold electric charge.

The differences between FIGS. 4C and 4G and between FIGS. 4D and 4H are whether or not electric charge is held in the second holding unit. The second holding unit is reset after a signal corresponding to the amount of electric charge held in the second holding unit has been read. In the states illustrated in FIGS. 4F to 4H, the second holding unit has not yet been reset. In the states illustrated in FIGS. 4F to 4H, the second holding unit has not yet been reset.

The operation illustrated in FIGS. 4A to 4H will be described in more detail with reference to FIGS. 2 and 5.

Figure 5:
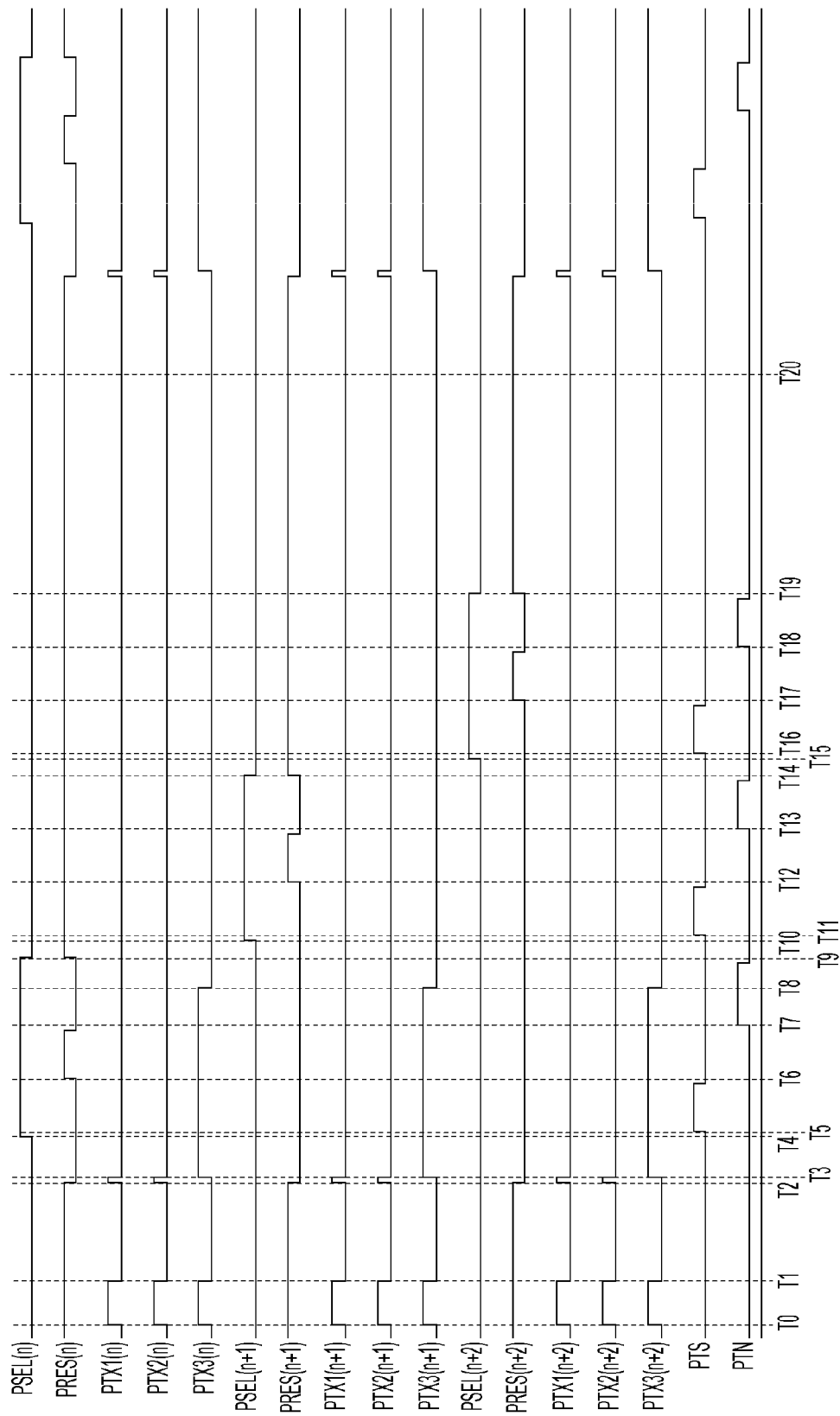
FIG. 5 is a timing diagram illustrating an operation according to the first exemplary embodiment.
Figure 6A:
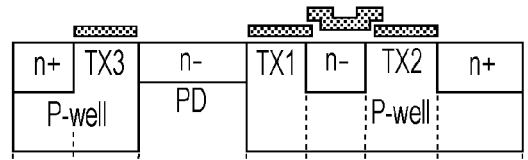

Signal names illustrated in FIG. 5 designate the signals illustrated in the equivalent circuit diagram of FIG. 2. In the configuration described here, the potentials of the first transfer units with respect to the electrons when the signals PTX1(n) to PTX1(n+2) are in the low level are lower than the potentials of the second and third transfer units with respect to the electrons when the signals PTX2(n) to PTX2(n+2) and PTX3(n) to PTX3(n+2) are in the low level.

Further, signals PTS and PTN are signals for controlling the operation of two sample and hold circuits included in the column circuit which are configured to sample and hold signals. Each of the sample and hold circuits performs the sampling operation when the affected signal PTS or PTN goes to the high level, and performs the holding operation when the affected signal PTS or PTN changes from the high level to the low level. Here, for ease of description, the sample and hold circuits sample and hold signals on the vertical signal line.

At time T0, the signals PTX1(n) to PTX1(n+2), PTX2(n) to PTX2(n+2), and PTX3(n) to PTX3(n+2) go to the high level. Thus, the electric charge generated in the photoelectric conversion units PD is discharged to the power supply via the third transfer units or via the first and second transfer units.

At time T1, the signals PTX1(n) to PTX1(n+2), PTX2(n) to PTX2(n+2), and PTX3(n) to PTX3(n+2) go to the low level. This state corresponds to that illustrated in FIG. 4B. The electric charge accumulation period starts at the time T1.

At time T2, the signals PRES(n) to PRES(n+2) go to the low level, and the reset state of the second holding units is cleared.

At the time T2, furthermore, the signals PTX1(n) to PTX1(n+2) and PTX2(n) to PTX2(n+2) go to the high level. Thus, the electric charge accumulated in the photoelectric conversion units PD, the first transfer units, and the first holding units is transferred to the second holding units. This state corresponds to that illustrated in FIG. 4E.

When the signals PTX1(n) to PTX1(n+2) and PTX2(n) to PTX2(n+2) go to the low level at time T3, potential barriers are formed again in the first and second transfer units. The period from the time T1 to the time T3 is the accumulation period.

At the time T3, furthermore, the signals PTX3(n) to PTX3(n+2) go to the high level. Thus, the electric charge generated in the photoelectric conversion units PD is discharged to the power supply via the third transfer units without being accumulated in the photoelectric conversion units PD. This state corresponds to that illustrated in FIG. 4F.

At time T4, the signal PSEL(n) goes to the high level. Thus, the selection transistors of the pixels in the n-th row are brought into conduction, and signals corresponding to the amount of electric charge held in the second holding units at this time appear in the vertical signal lines.

At time T5, the signal PTS temporarily goes to the high level. Thus, the levels of the vertical signal lines at this time are sampled and held. The levels sampled and held here include noise superimposed thereon in addition to the signals based on photoelectric conversion.

At time T6, the signal PRES(n) temporarily goes to the high level. Thus, the second holding units of the pixels in the n-th row are reset.

At time T7, the signal PTN temporarily goes to the high level. Thus, the levels of the vertical signal lines at this time are sampled and held. The levels sampled and held here are levels obtained when the second holding units are reset, and include noise. Differential processing of the signal sampled and held by the operation that begins at the time T5 and the signal sampled and held by the operation that begins at the time T7 is performed to reduce noise components having correlation which are commonly included in both signals.

When the signals PTX3(n) to PTX3(n+2) go to the low level at time T8, the potentials of the third transfer units with respect to the electrons are higher than the potentials of the photoelectric conversion units PD. This allows the photoelectric conversion units PD to accumulate electric charge again. The exposure time for the subsequent frame begins at the time T8.

When the signal PSEL(n) goes to the low level at time T9, the selection transistors SEL of the pixels in the n-th row are turned off, and the electrical connection between the amplification transistors SF and the vertical signal lines is disconnected. At the time T9, furthermore, the signal PRES(n) goes to the high level. Thus, the second holding units are reset.

During the periods from time T10 to time T14 and from time T15 to time T19, an operation equivalent to the operation performed during the period from the time T4 to the time T8, except that the signals PTX3(n) to PTX3(n+2) are maintained at the low level, is performed on the pixels in the (n+1)-th and (n+2)-th rows, respectively.

After time T20, the operation performed during the period from the time T0 to the time T19 is repeatedly performed.

FIGS. 4G and 4H illustrate the states of the pixels in the (n+1)-th row during the period from the time T8 to the time T12 or the states of the pixels in the (n+2)-th row during the period from the time T8 to the time T17. That is, in the illustrated states, the electric charge accumulated during the exposure period from the time T1 to the time T3 is held in the second holding unit of each pixel, and the photoelectric conversion unit PD and the first holding unit are to accumulate electric charge for the subsequent frame.

In FIG. 5, the signals PTX3(n) to PTX3(n+2) are in the high level during the period from the time T3 to the time T8. The time T8 when the signals PTX3(n) to PTX3(n+2) go to the low level may be set as desired in a period from the time T3 to the time when the signal PTS that goes to the high level at time T16 goes to the low level again. Specifically, the accumulation time may be changed in accordance with the amount of incident light.

According to this exemplary embodiment, the electric charge generated during the exposure period for a first frame is transferred to the second holding units of pixels in a plurality of rows. Thus, an in-plane synchronized electronic shutter may be implemented. In addition, the photoelectric conversion units PD and the first holding units may also accumulate electric charge for a second frame subsequent to the first frame within the period during which signals based on the electric charge held in the second holding units are read from the individual pixels.

In the related art, the electric charge generated in a period during which a signal is read from each pixel is discharged to the power supply from the third transfer unit. Thus, there is a risk that the sensitivity of the photoelectric conversion apparatus may not be sufficient. In contrast, according to this exemplary embodiment, while an in-plane synchronized electronic shutter may be implemented, the temporal resolution of the photoelectric conversion apparatus may be improved.

Second Exemplary Embodiment

A second exemplary embodiment, which is a modification of the first exemplary embodiment, will be described.

One of the differences from the first exemplary embodiment is that, in the first exemplary embodiment, for example, the first transfer units have a buried channel structure, whereas, in this exemplary embodiment, a relationship similar to that described above is implemented by controlling the potentials of the first transfer units. In this exemplary embodiment, when the signals PTX1 to PTX3 for controlling the potentials of the first to third transfer units are in the low level, the potentials of the first to third transfer units are equal. Specifically, the first to third transfer units may have similar configurations.

FIGS. 6A to 6H are cross-sectional views of a pixel PIX according to this exemplary embodiment, and also illustrate changes in the potential of the pixel PIX. FIGS. 6A to 6H correspond to FIGS. 4A to 4H, respectively. FIGS. 6B to 6H correspond to FIGS. 4B to 4H, respectively. The following description will be made mainly of the difference from the first exemplary embodiment.

The difference between FIG. 6B and FIG. 4B is that the potential of the first transfer unit is equal to the potentials of the second and third transfer units. The reason is that, unlike the first exemplary embodiment, the first transfer unit has a configuration similar to that of the second and third transfer units.

Also in the state illustrated in FIG. 6F, the potential of the first transfer unit is equal to the potentials of the second and third transfer units.

The relationships of potentials in the states other than those illustrated in FIGS. 6B and 6F are common to those illustrated in the corresponding ones of FIGS. 4B to 4F, and a description thereof is thus omitted.

Figure 7:
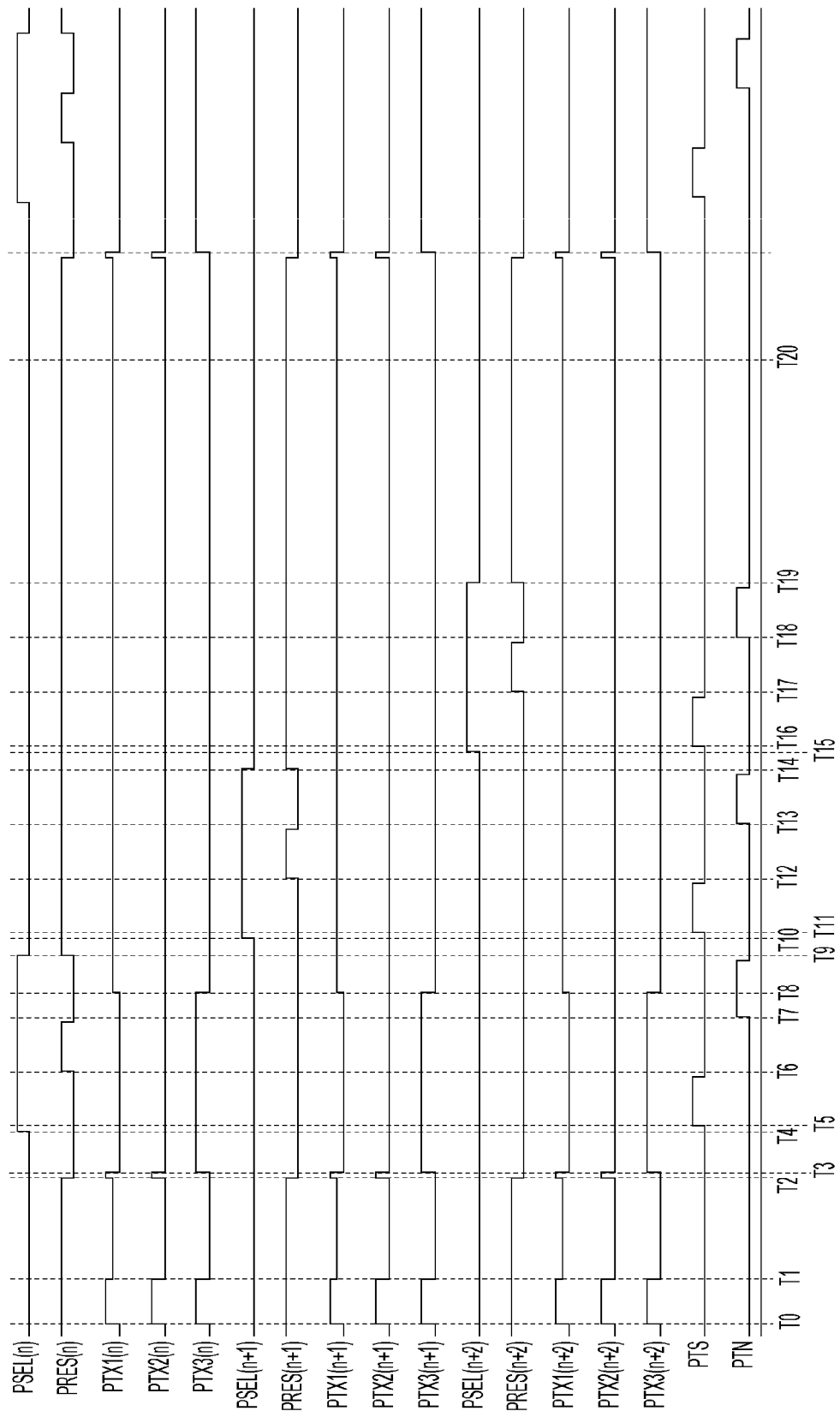
FIG. 7 is a timing diagram illustrating the operation according to the second exemplary embodiment.

FIG. 7 is a timing diagram illustrating an operation according to this exemplary embodiment, and corresponds to FIG. 5, which illustrates the first exemplary embodiment.

The difference from the operation illustrated in FIG. 5 is that the signals PTX1(n) to PTX1(n+2) take three values including high level, low level, and middle level, which is intermediate between the high level and the low level.

In this exemplary embodiment, during a period from time T1 to time T3 and an exposure period which begins at time T8, the signals PTX1(n) to PTX1(n+2) are set to the middle level. Thus, an operation similar to that in the first exemplary embodiment may be performed.

Since the first transfer units are controlled by a signal that may take at least three values, a similar operation may be performed without using a buried channel structure. In addition, since the first to third transfer units have equal potentials when the signals PTX1 to PTX3 are in the low level, the electric charge saturation levels of the photoelectric conversion units PD become high. With the use of this feature, only the photoelectric conversion units PD hold electric charge during the exposure period, and the electric charge is transferred from the photoelectric conversion units PD to the first holding units. Thus, an in-plane synchronized electronic shutter may also be implemented. Therefore, for example, if it is recognized in advance that the subject has high brightness, the operation according to this exemplary embodiment may be used to increase the electric charge saturation levels during the exposure period.

In the foregoing description, the first to third transfer units have equal potentials when the signals PTX1 to PTX3 are in the low level. However, the potentials of the first to third transfer units may not necessarily be exactly the same.

Third Exemplary Embodiment

Next, another exemplary embodiment will be described.

FIGS. 8A to 8H are cross-sectional views of a pixel PIX according to this exemplary embodiment, and also illustrate changes in the potential of the pixel PIX. FIGS. 8A to 8H correspond to FIGS. 4A to 4H, which illustrates the first exemplary embodiment, respectively. FIGS. 8B to 8H correspond to FIGS. 4B to 4H, respectively. The following description will be made mainly of the difference from the first exemplary embodiment.

One of the differences from the first exemplary embodiment is that the potentials of the third transfer units disposed between the photoelectric conversion units PD and the power supply take at least three values.

During the exposure period of the pixel PIX illustrated in FIGS. 8C and 8D, this exemplary embodiment is different from the first exemplary embodiment in that the potentials of the third transfer units with respect to the electrons are higher than those of the first transfer units and are lower than those of the second transfer units. Also, during the exposure period illustrated in FIGS. 8G and 8H, the potentials of the third transfer units with respect to the electrons are higher than those of the first transfer units and are lower than those of the second transfer units.

The relationship described above is maintained at least during the exposure period of the pixel PIX. Thus, even if electric charge is excessively generated in excess of the electric charge saturation levels of the photoelectric conversion unit PD, the first transfer unit, and the first holding unit, the excessively generated electric charge is discharged to the power supply via the third transfer unit without flowing into the second holding unit. That is, advantageously, electric charge is not likely to be mixed with electric charge generated during the previous exposure period, which is held in the second holding unit.

Figure 9:
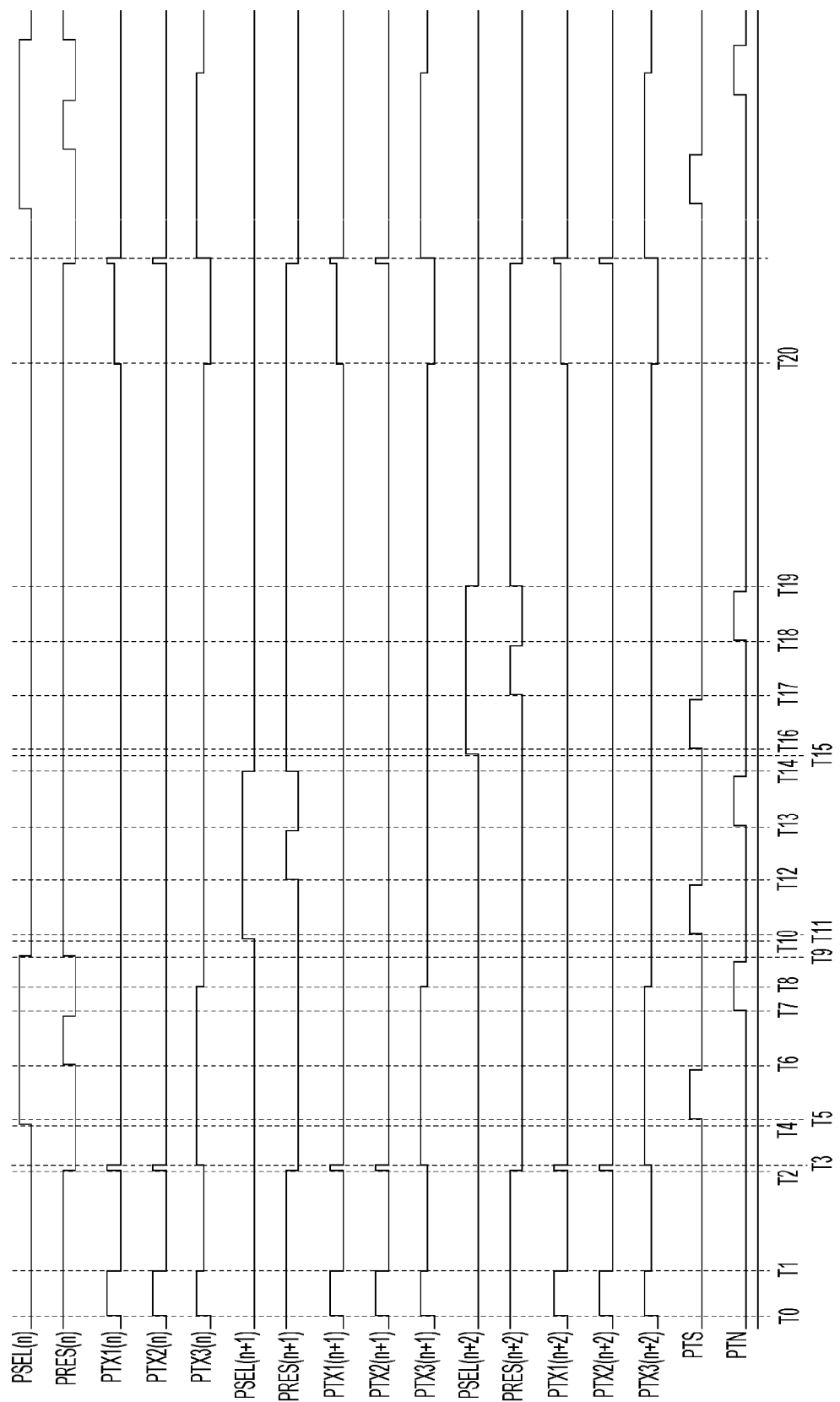
FIG. 9 is a timing diagram illustrating an operation according to the third exemplary embodiment.

FIG. 9 is a timing diagram illustrating an operation according to this exemplary embodiment, and corresponds to FIG. 5, which illustrates the first exemplary embodiment.

The difference from the operation illustrated in FIG. 5 is that the signals PTX3(n) to PTX3(n+2) take three values including high level, low level, and middle level, which is intermediate between the high level and the low level.

In this exemplary embodiment, during a period from time T1 to time T3 and an exposure period which begins at time T8, the signals PTX3(n) to PTX3(n+2) are set to the middle level. Thus, the operation described with reference to FIGS. 8A to 8H may be performed. The middle level may be set as desired in a range within which the potentials of the third transfer units with respect to the electrons are higher than those of the first transfer units and are lower than those of the second transfer units during the exposure period of the pixel PIX.

Fourth Exemplary Embodiment

Another exemplary embodiment will be described.

In the exemplary embodiments described above, during the exposure period of each pixel, electric charge is accumulated using the photoelectric conversion unit PD, the first transfer unit, and the first holding unit. The accumulated electric charge is transferred simultaneously to the second holding units of a plurality of pixels. Thus, an in-plane synchronized electronic shutter may be implemented. More consideration may be needed in terms of the signal-to-noise (S/N) ratio of the signal to be obtained.

For example, in FIG. 5, differential processing is performed on two signals sampled and held by the operation that begins at the time T5 and the operation that begins at the time T7. The signal sampled and held by the operation that begins at the time T5 contains the noise component caused by the reset of the second holding units by the time T2. In contrast, the signal sampled and held by the operation that begins at the time T7 contains the noise component caused by the reset of the second holding units from the time T6. That is, the two signals to be subjected to differential processing contain the noise components caused by different reset operations. For example, the noise unique to the reset transistors RES is common to both signals and may therefore be reduced by differential processing, whereas randomly generated components differ between the signals and may not therefore be reduced by differential processing.

Accordingly, this exemplary embodiment provides a drive method that may reduce random noise components caused by the operation of the reset transistors RES.

Figure 10A:
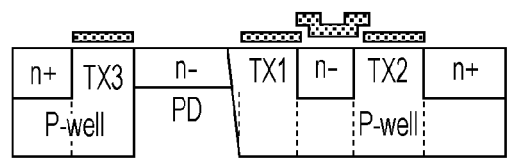
FIGS. 10A to 10H are diagrams illustrating the cross section of a pixel according to a fourth exemplary embodiment and the potential across the pixel.

FIG. 10A illustrates a portion of the pixel PIX illustrated in FIG. 3, where the illustration of the light shielding film 210, the plugs 209 and 215, and so forth is omitted. As illustrated in FIG. 10A, a portion of the electrode 206 that controls the potential of the first holding unit may overlap the electrodes 207 and 204 that control the potentials of the first and second transfer units.

In this exemplary embodiment, when the signals PTX1 to PTX3 for controlling the potentials of the first to third transfer units are in the low level, the potential of the first transfer unit with respect to the electrons is lower than the potentials of the second and third transfer units with respect to the electrons. This relationship may be obtained by, for example, configuring the first transfer unit to have a buried channel structure.

FIGS. 10B to 10H are diagrams illustrating the potentials at the respective regions of the pixel PIX illustrated in FIG. 10A, which are obtained at individual time points. In FIGS. 10B to 10H, the horizontal axis represents the positions of the elements corresponding to those illustrated in FIG. 10A, and the vertical axis represents potential, where the potential with respect to positive electric charge is shown increasing in the downward direction. In this exemplary embodiment, since the electric charge carriers to be accumulated in the photoelectric conversion unit are electrons, the potential with respect to electrons is shown increasing in the upward direction in the drawings.

Figure 10B:

FIG. 10B illustrates a state where no electric charge is accumulated in the photoelectric conversion unit PD or in the first or second holding unit. In this state, when the photoelectric conversion unit PD is irradiated with light, the generated electrons are accumulated in the n-region. In this state, the potentials of the first and third transfer units with respect to the electrons are higher than the potential of the photoelectric conversion unit PD, and electric charge may be accumulated in the photoelectric conversion unit PD. In other words, potential barriers with respect to the electrons are formed in the first and third transfer units. Since the potential of the third transfer unit with respect to the electrons is higher than the potential of the first transfer unit with respect to the electrons, the electric charge saturation level of the photoelectric conversion unit PD is determined in accordance with the potential of the first transfer unit. In other words, the potential barrier formed in the first transfer unit with respect to the electrons is lower than the potential barrier formed in the third transfer unit.

Figure 10C:
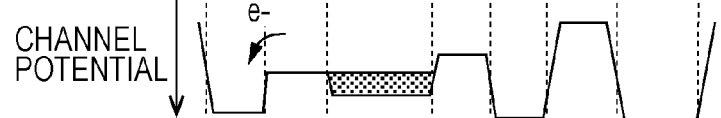

In this exemplary embodiment, in a period during which the photoelectric conversion unit PD is exposed to light to accumulate electric charge, the potential of the third transfer unit with respect to the electrons is made higher than that of the photoelectric conversion unit PD and lower than that of the first transfer unit. In this state, as the exposure of the photoelectric conversion unit PD progresses, the amount of electric charge generated in the photoelectric conversion unit PD exceeds the electric charge saturation level of the photoelectric conversion unit PD. As described earlier, since the potential of the third transfer unit with respect to the electrons is lower than the potential of the first transfer unit with respect to the electrons, electrons generated in excess of the electric charge saturation level of the photoelectric conversion unit PD are discharged to the power supply via the third transfer unit. This state is illustrated in FIG. 10C. In FIG. 10C, black shaded portions represent electrons. The state illustrated in FIG. 10C is a state where the photoelectric conversion unit PD is saturated, and electric charge further generated is discharged to the power supply.

Figure 10D:
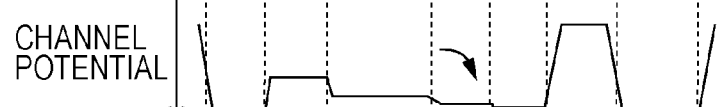

Then, the electric charge held in the photoelectric conversion unit PD is transferred to the first holding unit. At this time, the potential with respect to the electrons has a slope from the photoelectric conversion unit PD to the first holding unit. This state is illustrated in FIG. 10D.

Then, the potential of the first transfer unit with respect to the electrons is increased again to prevent electric charge from entering the first holding unit from the photoelectric conversion unit PD. At this time, the potential of the first transfer unit with respect to the electrons is made higher than that of the photoelectric conversion unit PD, and the potential of the third transfer unit is made lower than that of the photoelectric conversion unit PD. Thus, the electrons generated in the photoelectric conversion unit PD are discharged to the power supply via the third transfer unit. Therefore, the photoelectric conversion unit PD may be reset. This state is illustrated in FIG. 10E.

Figure 10E:
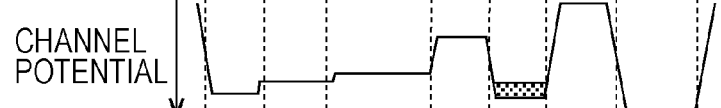
Figure 10F:
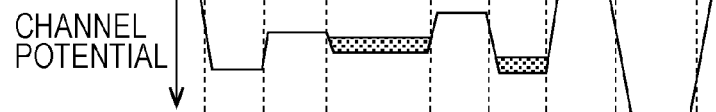

After the photoelectric conversion unit PD is reset in the state illustrated in FIG. 10E, the potential of the third transfer unit with respect to the electrons is made higher than that of the photoelectric conversion unit PD, thus allowing the photoelectric conversion unit PD to accumulate electric charge again. This state is illustrated in FIG. 10F. In the state illustrated in FIG. 10F, electric charge below the electric charge saturation level is accumulated in the photoelectric conversion unit PD.

As the exposure of the photoelectric conversion unit PD further progresses from the state illustrated in FIG. 10F, electric charge generated in excess of the electric charge saturation level of the photoelectric conversion unit PD is discharged to the power supply via the third transfer unit in a manner similar to that illustrated in FIG. 10C. This state is illustrated in FIG. 10G.

Figure 10G:
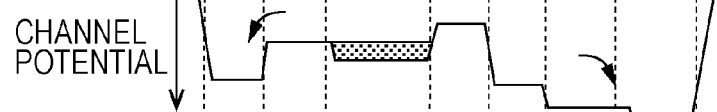

In the state illustrated in FIG. 10G, furthermore, the electric charge held in the first holding unit is transferred to the second holding unit via the second transfer unit.

After that, the potential of the second transfer unit with respect to the electrons is increased again to form a potential barrier between the first holding unit and the second holding unit. This state is illustrated in FIG. 10H.

The operation illustrated in FIGS. 10B to 10F is performed simultaneously on all the pixels to implement an in-plane synchronized shutter. The operation illustrated in FIGS. 10G to 10H is performed on a row-by-row basis.

Figure 10H:
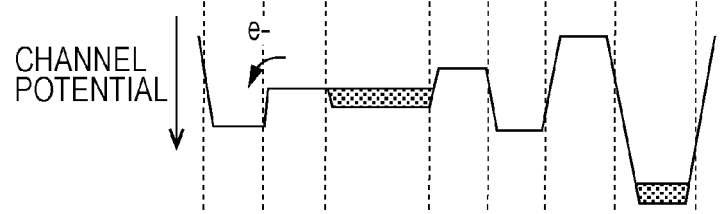

The difference between FIGS. 10C and 10H is whether or not electric charge is held in the second holding unit. The second holding unit is reset after a signal corresponding to the amount of electric charge held in the second holding unit has been read. In the states illustrated in FIGS. 10G to 10H, the second holding unit has not yet been reset.

The operation illustrated in FIGS. 10A to 10H will be described in more detail with reference to FIGS. 2 and 11.

Figure 11:
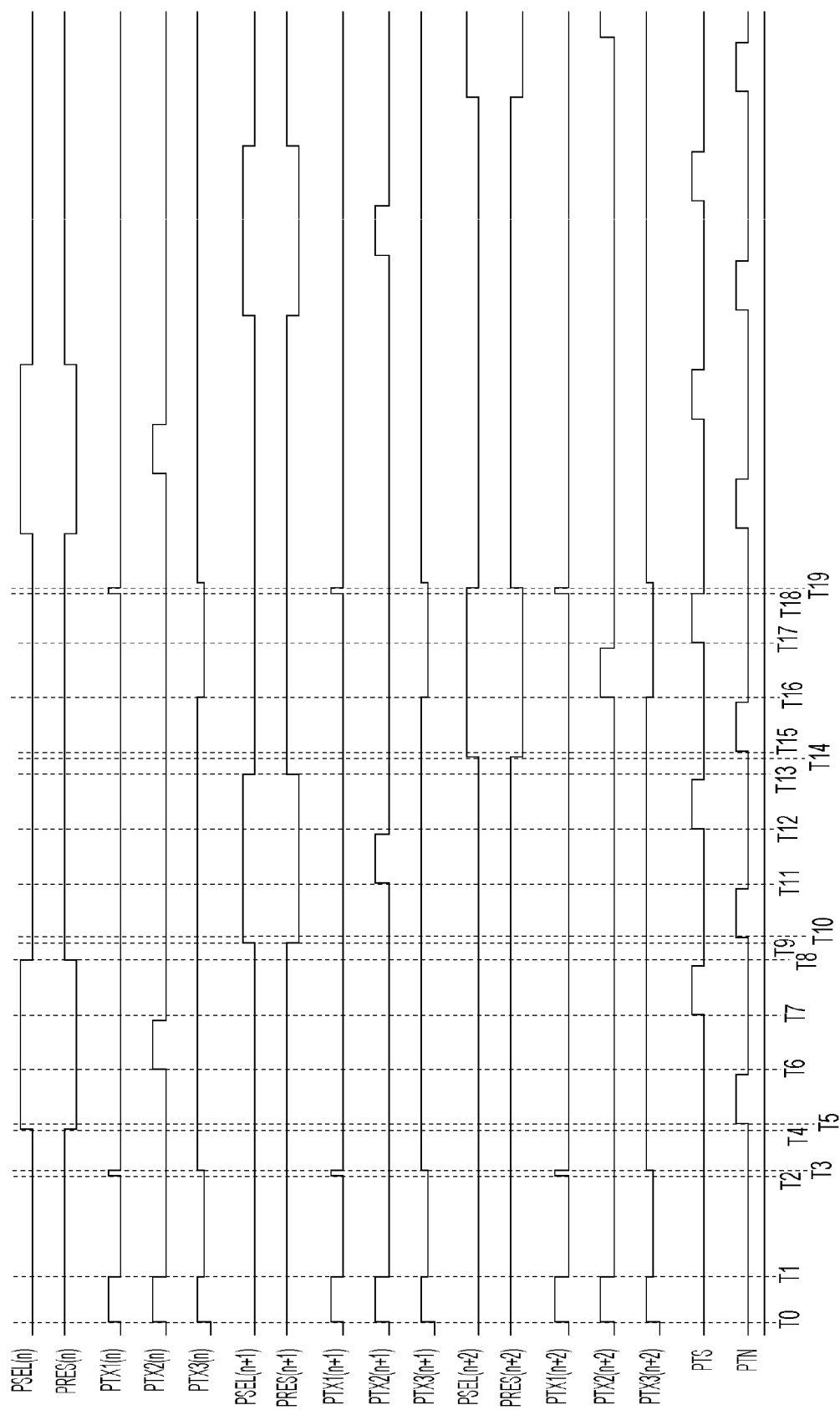
FIG. 11 is a timing diagram illustrating an operation according to the fourth exemplary embodiment.

Signal names illustrated in FIG. 11 designate the signals illustrated in the equivalent circuit diagram of FIG. 2. In the configuration described here, the potentials of the first transfer units with respect to the electrons when the signals PTX1(n) to PTX1(n+2) are in the low level are lower than the potentials of the second and third transfer units with respect to the electrons when the signals PTX2(n) to PTX2(n+2) and PTX3(n) to PTX3(n+2) are in the low level.

Further, signals PTS and PTN are signals for controlling the operation of two sample and hold circuits included in the column circuit which are configured to sample and hold signals. Each of the sample and hold circuits performs the sampling operation when the affected signal PTS or PTN goes to the high level, and performs the holding operation when the affected signal PTS or PTN changes from the high level to the low level. Here, for ease of description, the sample and hold circuits sample and hold signals on the vertical signal line.

At time T0, the signals PTX1(n) to PTX1(n+2), PTX2(n) to PTX2(n+2), and PTX3(n) to PTX3(n+2) go to the high level. Thus, the electric charge generated in the photoelectric conversion units PD is discharged to the power supply via the third transfer units or via the first and second transfer units.

At time T1, the signals PTX1(n) to PTX1(n+2), PTX2(n) to PTX2(n+2), and PTX3(n) to PTX3(n+2) go to the low level. This state corresponds to that illustrated in FIG. 10B. The electric charge accumulation period starts at the time T1.

At time T2, the signals PTX1(n) to PTX1(n+2) go to the high level. Thus, the electric charge accumulated in the photoelectric conversion units PD is transferred to the first holding units. This state corresponds to that illustrated in FIG. 10D.

When the signals PTX1(n) to PTX1(n+2) go to the low level at time T3, potential barriers are formed again in the first transfer units. The period from the time T1 to the time T3 is the accumulation period. During the accumulation period, the signals PTX3(n) to PTX3(n+2) are in the middle level, and the potentials obtained during this period are higher than those of the first transfer units and are lower than those of the photoelectric conversion units PD. Thus, the electric charge saturation levels of the photoelectric conversion units PD are determined in accordance with the potentials of the third transfer units. As illustrated in FIG. 10C, electric charge generated in excess of the electric charge saturation levels of the photoelectric conversion units PD is discharged to the power supply via the third transfer units.

At the time T3, furthermore, the signals PTX3(n) to PTX3(n+2) go to the high level. Thus, the electric charge generated in the photoelectric conversion units PD is discharged to the power supply via the third transfer units without being accumulated in the photoelectric conversion units PD. This state corresponds to that illustrated in FIG. 10E.

At time T4, the signal PRES(n) goes to the low level, and the reset state of the second holding units is cleared.

At the time T4, furthermore, the signal PSEL(n) goes to the high level. Thus, the selection transistors of the pixels in the n-th row are brought into conduction, and signals corresponding to the amount of electric charge held in the second holding units at this time appear in the vertical signal lines.

At time T5, the signal PTN temporarily goes to the high level. Thus, the levels of the vertical signal lines at this time are sampled and held. The levels sampled and held here include noise components caused by the reset of the second holding units.

At time T6, the signal PTX2(n) goes to the high level. Thus, the electric charge held in the first holding units is transferred to the second holding units.

At time T7, the signal PTS temporarily goes to the high level. Thus, the levels of the vertical signal lines at this time are sampled and held. The levels sampled and held here include noise components sampled and held by the operation that begins at the time T5, in addition to the signal corresponding to the amount of electric charge transferred to the second holding units at the time T6. Differential processing of the signal sampled and held by the operation that begins at the time T5 and the signal sampled and held by the operation that begins at the time T7 is performed to reduce noise components having correlation which are commonly included in both signals. In this exemplary embodiment, two signals to be subjected to differential processing include noise caused by canceling the reset of the second holding units at the time T4. Therefore, randomly generated noise components as well as inevitably generated noise may be reduced.

When the signal PSEL(n) goes to the low level at time T8, the selection transistors SEL of the pixels in the n-th row are turned off, and the electrical connection between the amplification transistors SF and the vertical signal lines is disconnected. At the time T8, furthermore, the signal PRES(n) goes to the high level. Thus, the second holding units are reset.

During a period from time T9 to time T13, an operation equivalent to the operation performed during the period from the time T4 to the time T8 is performed on the pixels in the (n+1)-th row.

During a period from time T14 to time T19, an operation equivalent to the operation performed during the period from the time T4 to the time T8 is performed on the pixels in the (n+2)-th row.

The operation performed during the period from the time T14 to the time T19 is different from the operation performed during the period from the time T4 to the time T8 and the operation performed during the period from the time T9 to the time T13 in that the photoelectric conversion units PD start to accumulate electric charge.

In this exemplary embodiment, the signals PTX3(n) to PTX3(n+2) go to the middle level at time T16. Thus, the photoelectric conversion units of the pixels in the n-th to (n+2)-th rows are brought into the state where electric charge may be accumulated.

At time T18, the signals PTX1(n) to PTX1(n+2) go to the high level. Thus, the electric charge accumulated in the photoelectric conversion units PD during the period which begins at the time T16 is transferred to the first holding units.

After the time T19, the operation performed during the period from the time T3 to the time T19 is repeatedly performed.

In FIG. 11, the signals PTX3(n) to PTX3(n+2) are in the high level during the period from the time T3 to the time T16. The time T16 when the signals PTX3(n) to PTX3(n+2) go to the middle level may be set as desired within a period from the time T3 to the time when the signal PTS that goes to the high level at time T17 goes to the low level again. Specifically, the accumulation time may be changed in accordance with the amount of incident light.

According to this exemplary embodiment, the electric charge generated during the exposure period for a first frame is transferred to the first holding units of pixels in a plurality of rows. Thus, an in-plane synchronized electronic shutter may be implemented. In addition, the photoelectric conversion units PD may also accumulate electric charge for a second frame subsequent to the first frame during the period during which signals are read from the individual pixels.

According to this exemplary embodiment, while an in-plane synchronized electronic shutter may be implemented, random noise components caused by the reset of the second holding units may be reduced.

In the first and second exemplary embodiments, electric charge is accumulated in the photoelectric conversion units, the first transfer units, and the first holding units. In this exemplary embodiment, in contrast, electric charge is accumulated only in the photoelectric conversion units PD. Thus, the operation according to this exemplary embodiment requires a lower electric charge saturation level than the first and second exemplary embodiments.

Accordingly, the operation according to the first or second exemplary embodiment and the operation according to this exemplary embodiment may be switched in accordance with the imaging conditions. The operations may be switched by providing a light amount detector separately from the photoelectric conversion apparatus and by selecting the operation according to the first or second exemplary embodiment if the amount of light detected by the light amount detector is large or selecting the operation according to this exemplary embodiment if the amount of light is small. Alternatively, in order to successively acquire a plurality of frames, the amount of incident light may be estimated from the signal level of the preceding frame, and the operation to be performed in the subsequent frame may be selected.

Generally, digital cameras and digital camcorders are designed to switch sensitivity levels. In this case, the operations described above may be switched in accordance with the sensitivity level. Specifically, the operation according to this exemplary embodiment may be performed for the setting of a relatively low sensitivity level, and the operation according to the first or second exemplary embodiment may be performed for the setting of a relatively high sensitivity level.

Fifth Exemplary Embodiment

Another exemplary embodiment will be described.

One of the differences from the fourth exemplary embodiment is that, in the fourth exemplary embodiment, the potentials of the third transfer units are controlled by using three values, namely, high level, low level, and middle level, whereas, in this exemplary embodiment, the potentials of the third transfer units are controlled by using two values, namely, high level and low level.

FIGS. 12A to 12H are cross-sectional views of a pixel PIX according to this exemplary embodiment, and also illustrate changes in the potential of the pixel PIX. FIGS. 12A to 12H correspond to FIGS. 10A to 10H, respectively. FIGS. 12B to 12H correspond to FIGS. 10B to 10H, respectively. The following description will be made mainly of the difference from the fourth exemplary embodiment.

In contrast to the potential diagrams of the fourth exemplary embodiment illustrated in FIGS. 10A to 10H, in the potential diagrams according to this exemplary embodiment illustrated in FIGS. 12A to 12H, the potential of the third transfer unit is higher than that of the first transfer unit during the period illustrated in FIGS. 12C to 12H. As a result, unlike FIGS. 10C, 10G, and 10H, the electric charge generated in the photoelectric conversion unit is not discharged to the power supply via the third transfer unit.

Figure 13:
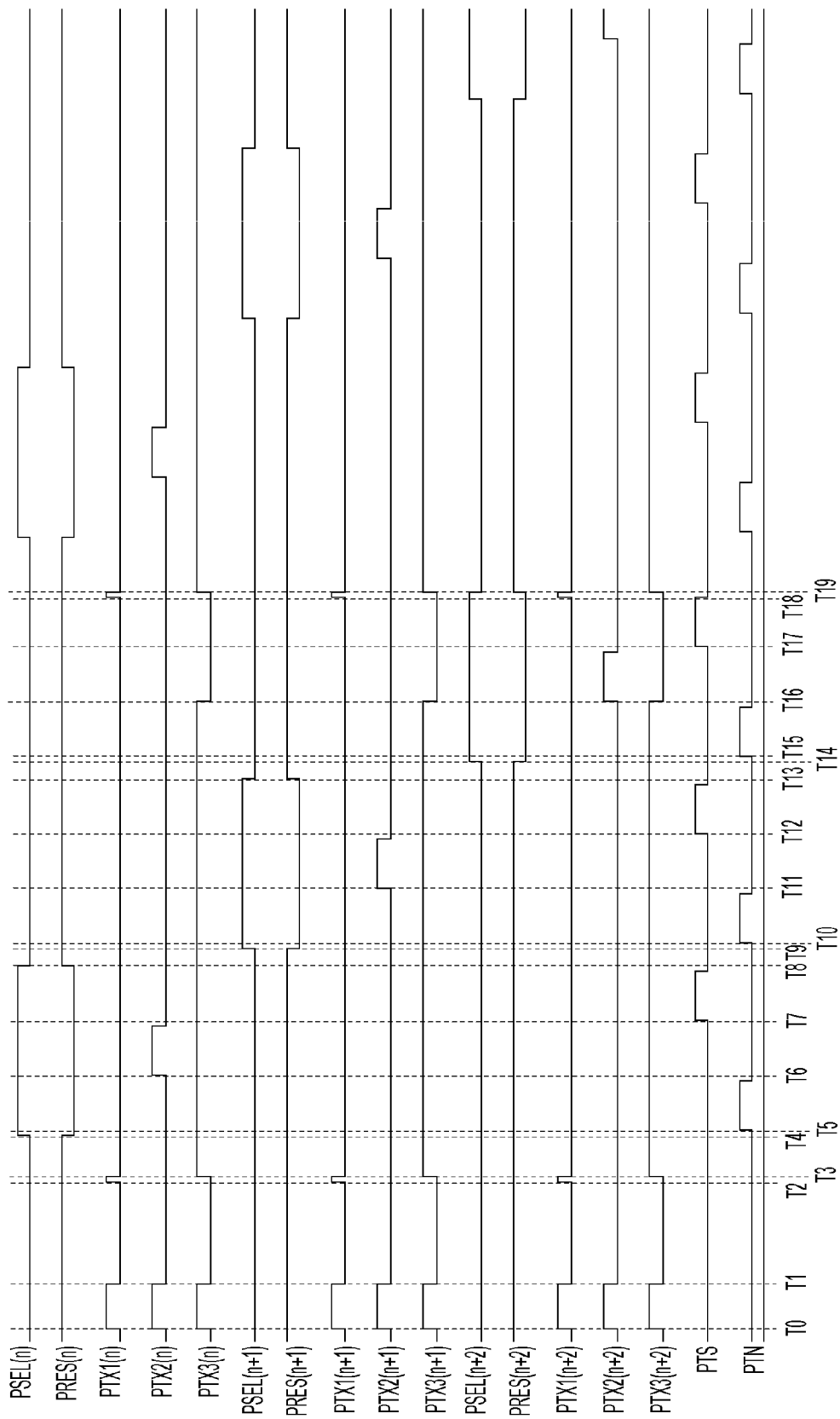
FIG. 13 is a timing diagram illustrating an operation according to the fifth exemplary embodiment.

A timing diagram illustrated in FIG. 13 is substantially the same as the timing diagram illustrated in FIG. 11, except that the signals PTX3(n) to PTX3(n+2) are in the high level in a period during which the signals PTX3(n) to PTX3(n+2) are in the middle level in FIG. 11, and a description thereof is thus omitted.

Also in this exemplary embodiment, similarly to the fourth exemplary embodiment, while an in-plane synchronized electronic shutter may be implemented, random noise components caused by the reset of the second holding units may be reduced.

Reference Example

The photoelectric conversion apparatus may perform operations other than those described above.

An operation according to a reference example will be described with reference to FIGS. 14 and 15.

One of the differences between the operation according to the reference example and the operation according to the fourth exemplary embodiment is that, in the reference example, during a period during which signals based on the amount of electric charge held in the second holding units are output, electric charge generated in the photoelectric conversion units is not accumulated and is discharged to the power supply via the third transfer units. In other words, the operation of reading a signal from each pixel and the operation of accumulating electric charge in the photoelectric conversion unit are not multiplexed in time.

In the reference example, during the exposure period of the photoelectric conversion unit, the potentials of the first transfer units with respect to the electrons are set higher than those of the photoelectric conversion units and are set lower than those of the third transfer units. Thus, the electric charge saturation levels of the photoelectric conversion units are determined in accordance with the potentials of the first transfer units. In this configuration, any electric charge generated in excess of the electric charge saturation levels is transferred to the first holding units via the first transfer units.

Figure 14:
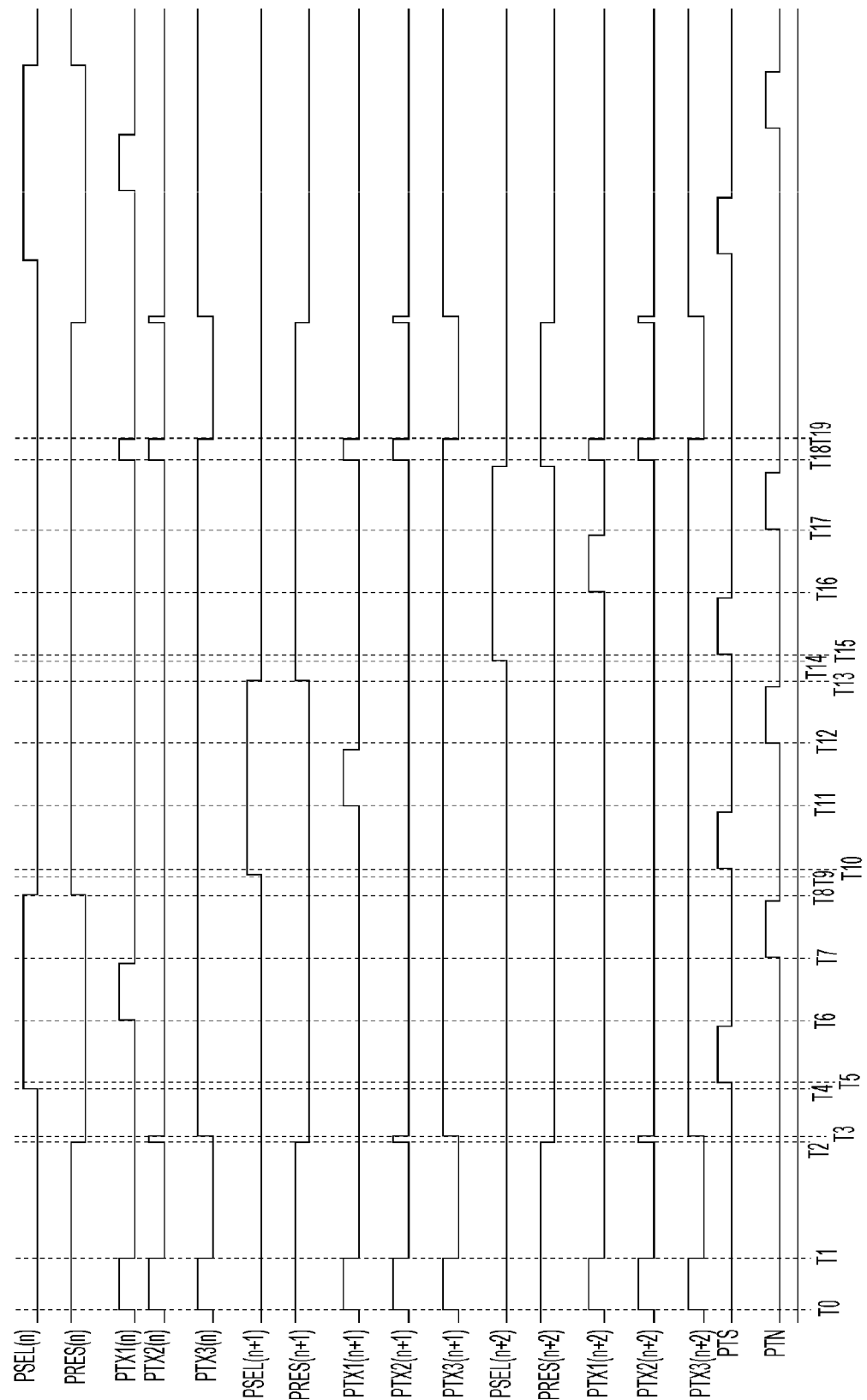
FIG. 14 is a timing diagram illustrating an operation according to a reference example.

FIG. 14 is a timing diagram illustrating the operation according to the reference example. A description will be made mainly of the difference from the timing diagram of the fourth exemplary embodiment illustrated in FIG. 11.

In the fourth exemplary embodiment, the signals PTX3(n) to PTX3(n+2) are in the middle level during the exposure period from the time T1 to the time T3, whereas, in the reference example, the signals PTX3(n) to PTX3(n+2) are in the low level. Thus, the potentials of the third transfer units with respect to the electrons are higher than those in the fourth exemplary embodiment. Therefore, electric charge generated in excess of the electric charge saturation levels of the photoelectric conversion units is not discharged to the power supply but is accumulated in the first holding units via the first transfer units.

Further, unlike the fourth exemplary embodiment, during the period from the time T2 to the time T3, the signals PTX1(n) to PTX1(n+2) are maintained at the low level while the signals PTX2(n) to PTX2(n+2) go to the high level. The reason is as follows. In the operation according to the fourth exemplary embodiment, only the photoelectric conversion units accumulate electric charge, and the exposure period of the pixels ends at the time when the electric charge is transferred to the first transfer units. In the reference example, in contrast, the first holding units accumulate electric charge. Accordingly, the signals PRES(n) to PRES(n+2) go to the low level at the time T2.

The electric charge generated in the photoelectric conversion units and accumulated in the first holding units during a period up to the time T3 is transferred to the second holding units in response to the signals PTX2(n) to PTX2(n+2) changed to the low level at the time T3. The foregoing operation is performed simultaneously on pixels in a plurality of rows, thereby implementing an in-plane synchronized electronic shutter.

In the reference example, the signals PTX3(n) to PTX3(n+2) go to the high level at the time T3, and the potentials of the third transfer units with respect to the electrons become lower than the potentials of the photoelectric conversion units with respect to the electrons. As a result, the electric charge held in the photoelectric conversion units until the time T3 and the electric charge generated after the time T3 are discharged to the power supply via the third transfer units.

In the operation which begins at the time T4, the pixels in the n-th to (n+2)-th rows are sequentially selected by the vertical scanning unit 4, and a signal is read from each of the pixels.

Also in the reference example, the sample and hold operation is performed twice per pixel in order to reduce noise components. In the reference example, as in the first exemplary embodiment, a signal based on electric charge obtained through photoelectric conversion is first sampled and held.

During the period from time T18 to time T19, the signals PTX1(n) to PTX1(n+2) and the signals PTX2(n) to PTX2(n+2) are in the high level, thereby resetting the electric charge held in the photoelectric conversion units, the first holding units, and the second holding units. The subsequent exposure period begins at the time T19.

In the operation illustrated in FIG. 14, the signals PRES(n) to PRES(n+2) are in the high level during a period other than the period during which signals are read from pixels in each row. Alternatively, before the signals PTX2(n) to PTX2(n+2) go to the high level, the signals PRES(n) to PRES(n+2) may be pulsed to the high level.

The foregoing operation allows the accumulation time start and end to be defined, as desired, even if a larger amount of electric charge than that the photodiodes may accumulate is generated in the photodiodes.

Figure 15:
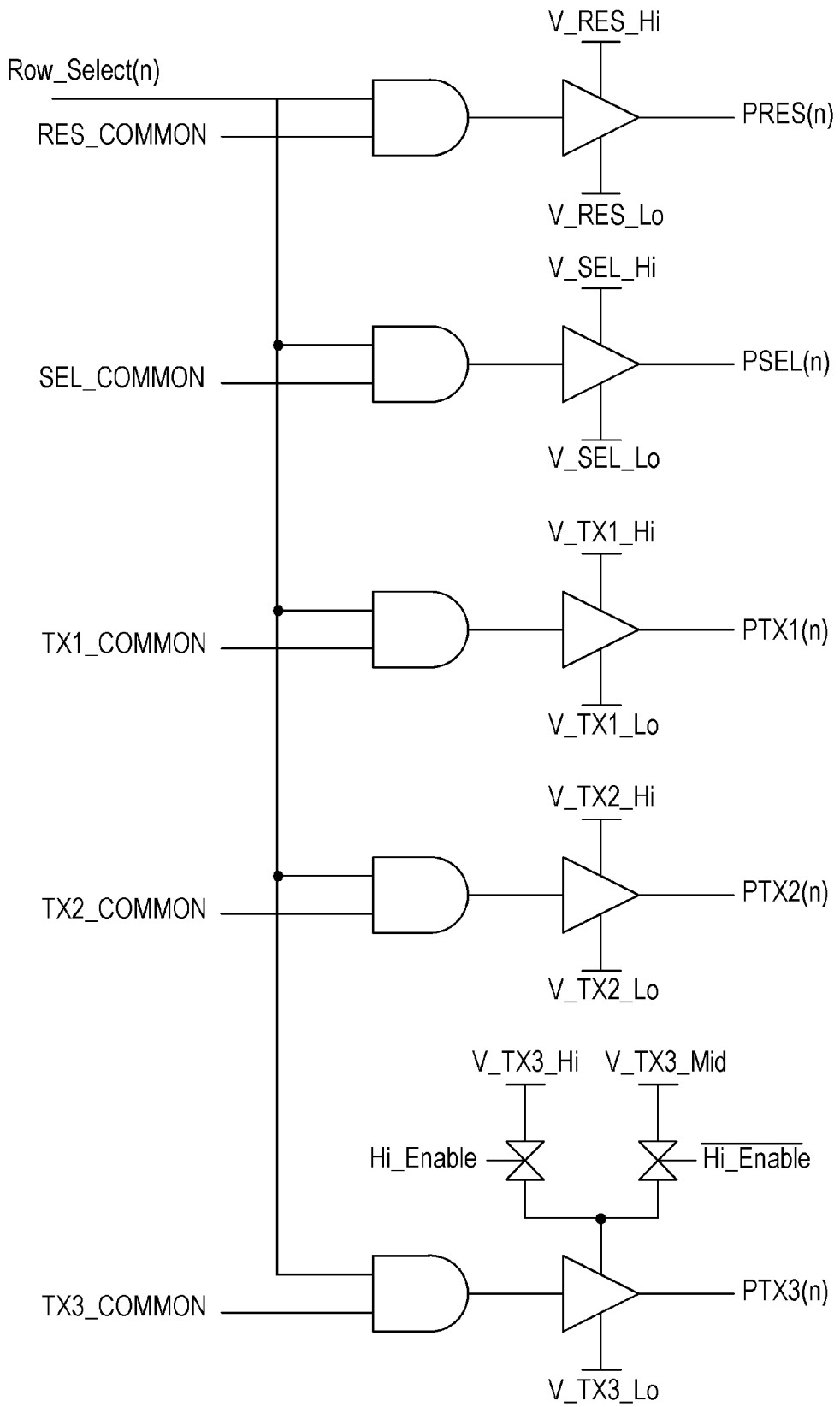
FIG. 15 is a diagram illustrating the configuration of a vertical scanning unit according to the reference example.

FIG. 15 is a diagram illustrating the configuration of a portion of a vertical scanning unit according to the reference example. Particularly, the output portion for the pixels in the n-th row is illustrated.

The output portion for the pixels in the n-th row includes five AND circuits provided in parallel, and each of the AND circuits is provided with a buffer circuit. The buffer circuits are, for example, inverter circuits.

In FIG. 15, a signal Row_Select(n) is the output of a shift register or a decoder (not illustrated) for the n-th row in the pixel array. The signal Row_Select(n) is commonly input to first input terminals of the five AND circuits.

One of signals RES_COMMON, SEL_COMMON, TX1_COMMON, TX2_COMMON, and TX3_COMMON is supplied to each of second input terminals of the five AND circuits, and the logical AND of the supplied signal and the signal Row_Select(n) appears as the output of the AND circuit.

The buffer circuits provided after the AND circuits to which the signals RES_COMMON, SEL_COMMON, TX1_COMMON, and TX2_COMMON are supplied are configured to provide a high-level or low-level output. For example, the focus is now on the AND circuit to which the signal RES_COMMON is supplied. If the logical AND of the signal Row_Select(n) and the RES_COMMON is 1, the buffer output is the power supply V_RES_Hi, and the signal PRES(n) is set to the high level. If the logical AND of the signal Row_Select(n) and the RES_COMMON is 0, the buffer output is the power supply V_RES_Lo, and the signal PRES(n) is set to the low level.

The buffer circuit provided after the AND circuit to which the signal PTX3_COMMON is supplied is configured to allow the power supply of the buffer circuit to take three values so that a middle-level signal PTX3(n) may be output. Here, a high-level voltage V_TX3_Hi and a middle-level voltage V_TX3_Mid are switched by a signal Hi_Enable. A signal /Hi_Enable is in opposite phase to the signal Hi_Enable.

With the foregoing configuration, a middle-level signal may be supplied to the pixels in the imaging region.

Unit pixels each having the configuration illustrated in FIG. 15 are provided for the individual rows in the imaging region. The signals PRES(n) to PRES(n+2), PSEL(n) to PSEL(n+2), PTX1(n) to PTX1(n+2), PTX2(n) to PTX2(n+2), and PTX3(n) to PTX3(n+2) are commonly supplied to the unit pixels.

While the signal PTX3(n) may take the middle level as an example, also in the operations of the exemplary embodiments described above, a desired signal may be output at the middle level with a configuration similar to that described above.

Sixth Exemplary Embodiment

Another exemplary embodiment will be described.

Figure 16:
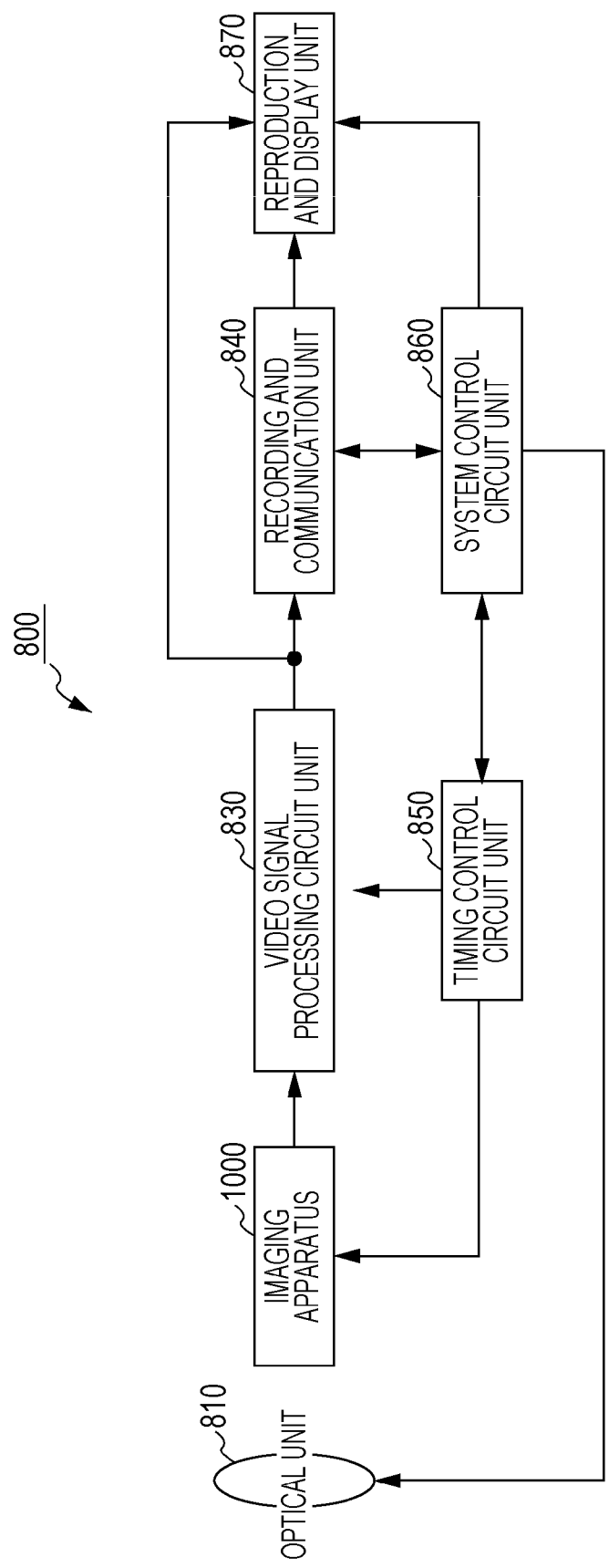
FIG. 16 is a block diagram illustrating the configuration of an imaging system according to a sixth exemplary embodiment.

FIG. 16 illustrates an overview of an imaging system 800 according to this exemplary embodiment.

The imaging system 800 includes, for example, an optical unit 810, an imaging apparatus 1000, a video signal circuit unit 830, a recording and communication unit 840, a timing control circuit unit 850, a system control circuit unit 860, and a reproduction and display unit 870. The photoelectric conversion apparatus described above in any of the foregoing exemplary embodiments is used as the imaging apparatus 1000. Here, as an illustrative example, the control unit 3 illustrated in FIG. 1 is included in the timing control circuit unit 850 rather than the imaging apparatus 1000.

The optical unit 810 may be an optical system including a lens, and is configured to focus light from the subject onto a pixel array of the imaging apparatus 1000 on which a plurality of pixels are arranged in a two-dimensional array to form an image of the subject. The imaging apparatus 1000 outputs a signal corresponding to the light focused on the pixel array at the timing based on a signal supplied from the timing control circuit unit 850.

The signal output from the imaging apparatus 1000 is input to the video signal circuit unit 830, which is a video signal processing unit, and the video signal circuit unit 830 performs processing such as analog-to-digital (AD) conversion on the input electrical signal in accordance with a method determined in advance by a program or the like. The signal obtained by the processing of the video signal circuit unit 830 is sent to the recording and communication unit 840 as image data. The recording and communication unit 840 sends a signal for forming an image to the reproduction and display unit 870 to cause the reproduction and display unit 870 to reproduce and display a moving image or a still image. The recording and communication unit 840 also communicates with the system control circuit unit 860 in response to a signal from the video signal circuit unit 830, and further performs an operation of recording the signal for forming an image on a recording medium (not illustrated).

The system control circuit unit 860 is configured to control the overall operation of the imaging system 800, and controls the driving of the optical unit 810, the timing control circuit unit 850, the recording and communication unit 840, and the reproduction and display unit 870. Further, the system control circuit unit 860 includes a storage device (not illustrated), which is, for example, a recording medium, on which a program and the like necessary to control the operation of the imaging system 800 are recorded. Further, the system control circuit unit 860 supplies a signal for switching the driving mode in accordance with, for example, the operation of the user to internal units of the imaging system 800. Specific examples include changing a row to be read or reset, changing the angle of view in accordance with electronic zoom magnification, and shifting the angle of view for electronic image stabilization. In addition, the system control circuit unit 860 switches among the operation modes in the foregoing exemplary embodiments and switches the output of the digital selector in the fifth exemplary embodiment.

The timing control circuit unit 850 controls the timing for driving the imaging apparatus 1000 and the video signal circuit unit 830 in accordance with control of the system control circuit unit 860, which is a control unit.

The video signal circuit unit 830 holds correction coefficients described in the foregoing exemplary embodiments, and performs correction processing on the signal output from the imaging apparatus 1000.

The imaging system 800 may also include a sensor for detecting an amount of light. As described earlier, the system control circuit unit 860 may switch the operation of the photoelectric conversion apparatus, or the imaging apparatus 1000, in accordance with the amount of light detected by the sensor.

The exemplary embodiments described above are merely illustrative of the disclosure, and may be changed or combined without departing from the technical spirit of the disclosure.

Other Exemplary Embodiments

The foregoing exemplary embodiments are merely illustrative of the disclosure, and may be changed or combined with any other exemplary embodiment without departing from the technical spirit of the disclosure.

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A method for driving a photoelectric conversion apparatus including
    a first pixel, the first pixel including a photoelectric conversion unit configured to accumulate charge;
    a first holding unit configured to hold the charge;
    a second holding unit configured to hold the charge;
    a first transfer unit configured to transfer the charge from the photoelectric conversion unit to the first holding unit;
    a second transfer unit configured to transfer the charge from the first holding unit to the second holding unit; and
    a third transfer unit configured to electrically connect the photoelectric conversion unit and a power supply,
    the method comprising:
    a first controlling step of controlling the first and third transfer units to form a potential barrier in the first transfer unit and a potential barrier in the third transfer unit against the charge in the photoelectric conversion unit when accumulating charge in the photoelectric conversion unit, wherein the potential barrier in the first transfer unit is lower than the potential barrier in the third transfer unit,
    after the first controlling step, a second controlling step of controlling the first, second and third transfer units so that:
    a potential barrier in the third transfer unit is formed;
    a potential in the first transfer unit for the charge is lower than a potential in the photoelectric conversion unit; and
    a potential in the second transfer unit is lower than the potential in the first transfer unit while a potential in the third transfer unit is higher than the potential in the first transfer unit, and
    after the second controlling step, a third controlling step of controlling the third transfer unit to reset the photoelectric conversion unit and thereafter to form a potential barrier in the third transfer unit.

2. The method according to claim 1, wherein
    first control signals are respectively provided to the first and second transfer units, the first control signals being configured to form potential barriers in the first and second transfer units,
    second control signals are respectively provided to the first and second transfer units, the second control signals being configured not to form potential barriers in the first and second transfer units, and
    the second controlling step includes simultaneously providing the second control signals to the first and second transfer units.

3. The method according to claim 1, wherein
in the third controlling step, the reset of the photoelectric conversion unit is conducted before transferring the charge from the first holding unit to the second holding unit.

4. The method according to claim 1, wherein
the first controlling step includes controlling the second transfer unit to form a potential barrier in the second transfer unit.

5. The method according to claim 1, wherein
the third controlling step includes controlling the second transfer unit to form a potential barrier in the second transfer unit when resetting the photoelectric conversion unit.

6. A photoelectric conversion apparatus including a first pixel, the first pixel including a photoelectric conversion unit configured to accumulate charge;
   a first holding unit configured to hold the charge;
   a second holding unit configured to hold the charge;
   a first transfer unit configured to transfer the charge from the photoelectric conversion unit to the first holding unit;
   a second transfer unit configured to transfer the charge from the first holding unit to the second holding unit; and
   a third transfer unit configured to electrically connect the photoelectric conversion unit and a power supply; and a control unit, wherein the control unit controls the first and third transfer units to form a potential barrier in the first transfer unit and a potential barrier in the third transfer unit against the charge in the photoelectric conversion unit when accumulating charge in the photoelectric conversion unit, wherein the potential barrier in the first transfer unit is lower than the potential barrier in the third transfer unit, thereafter, the control unit controls the first, second and third transfer units so that:

a potential barrier in the third transfer unit is formed;

a potential in the first transfer unit for the charge is lower than a potential in the photoelectric conversion unit; and a potential in the second transfer unit is lower than the potential in the first transfer unit while a potential in the third transfer unit is higher than the potential in the first transfer unit, and thereafter, the control unit controls the third transfer unit to reset the photoelectric conversion unit and thereafter to form a potential barrier in the third transfer unit.

7. An imaging system comprising
the apparatus according to claim 6; and
an optical system that focuses light to the first pixel.

* * * * *